United States Patent
Mickel et al.

(10) Patent No.: US 9,336,870 B1
(45) Date of Patent: May 10, 2016

(54) METHODS FOR RESISTIVE SWITCHING OF MEMRISTORS

(71) Applicant: Sandia Corporation, Albuquerque, NM (US)

(72) Inventors: Patrick R. Mickel, Albuquerque, NM (US); Conrad D. James, Albuquerque, NM (US); Andrew Lohn, Santa Monica, CA (US); Matthew Marinella, Albuquerque, NM (US); Alexander H. Hsia, Albuquerque, NM (US)

(73) Assignee: Sandia Corporation, Albuquerque, NM (US)

(*) Notice: Subject to any disclaimer, the term of this patent is extended or adjusted under 35 U.S.C. 154(b) by 0 days.

(21) Appl. No.: 14/612,958

(22) Filed: Feb. 3, 2015

Related U.S. Application Data

(63) Continuation-in-part of application No. 14/462,472, filed on Aug. 18, 2014.

(60) Provisional application No. 61/866,690, filed on Aug. 16, 2013.

(51) Int. Cl.
*G11C 11/00* (2006.01)
*G11C 13/00* (2006.01)

(52) U.S. Cl.
CPC .......... *G11C 13/0011* (2013.01); *G11C 13/004* (2013.01); *G11C 13/0069* (2013.01)

(58) Field of Classification Search
CPC ....................................................... G11C 11/00
USPC ......................................................... 365/148
See application file for complete search history.

(56) References Cited

U.S. PATENT DOCUMENTS

| 7,129,133 | B1 | 10/2006 | Avanzino et al. |
| 8,249,838 | B2 | 8/2012 | Pino et al. |
| 8,395,926 | B2 | 3/2013 | Kreupl et al. |
| 8,450,711 | B2 | 5/2013 | Williams et al. |
| 8,835,272 | B1 | 9/2014 | Mickel et al. |
| 8,872,246 | B1 | 10/2014 | Stevens et al. |
| 2011/0005572 | A1* | 1/2011 | Shimizu ............ H01L 31/0475 136/244 |
| 2011/0169136 | A1 | 7/2011 | Pickett et al. |
| 2012/0104347 | A1 | 5/2012 | Quick |
| 2014/0027705 | A1 | 1/2014 | Yang et al. |
| 2014/0301127 | A1* | 10/2014 | Kim ................. G11C 13/0004 365/148 |
| 2015/0016178 | A1* | 1/2015 | Nardi ..................... H01L 45/08 365/148 |
| 2015/0248922 | A1* | 9/2015 | Hyun ..................... G11C 16/16 365/218 |

OTHER PUBLICATIONS

Physical modeling of voltage-driven resistive switching in oxide RRAM Ielmini, D.; Larentis, S.; Balatti, S. Integrated Reliability Workshop Final Report (IRW), 2012 IEEE International Year: 2012 pp. 9-15, DOI: 10.1109/IIRW.2012.6468905.*

(Continued)

*Primary Examiner* — Min Huang
(74) *Attorney, Agent, or Firm* — Helen S. Baca

(57) ABSTRACT

The present invention is directed generally to resistive random-access memory (RRAM or ReRAM) devices and systems, as well as methods of employing a thermal resistive model to understand and determine switching of such devices. In particular example, the method includes generating a power-resistance measurement for the memristor device and applying an isothermal model to the power-resistance measurement in order to determine one or more parameters of the device (e.g., filament state).

19 Claims, 15 Drawing Sheets

(56) References Cited

OTHER PUBLICATIONS

"Temperature Robust Phase Change Memory Using Quaternary Material System Based on Ga2TeSb7" Chuang, A.T.H. et al. Memory Workshop (IMW), 2011 3rd IEEE International Year: 2011 pp. 1-3, DOI: 10.1109/IMW.2011.5873240.*
U.S. Appl. No. 13/780,262, filed Feb. 28, 2013, Mickel et al.
U.S. Appl. No. 13/750,451, filed Jan. 25, 2013, Stevens et al.
U.S. Appl. No. 14/462,472, filed Aug. 18, 2014, Lohn et al.
Abdalla H et al., "SPICE modeling of memristors," *IEEE Int3 l Symp. on Circuits and Systems*, held on May 15-18, 2011 in Rio de Janeiro, pp. 1832-1835.
Ambrogio S et al., "Understanding switching variability and random telegraph noise in resistive RAM," *IEEE Int'l Electron Dev. Meeting*, held on Dec. 9-11, 2013 in Washington, DC, pp. 31.5.1-31.5.4.
Balatti S et al., "Multiple memory states in resistive switching devices through controlled size and orientation of the conductive filament," *Adv. Mater.* 2013;25:1474-8.
Balatti S et al., Supporting Information for "Multiple memory states in resistive switching devices through controlled size and orientation of the conductive filament," *Adv. Mater.* 2013;25:1474-8 (6 pp.).
Biolek Z et al., "SPICE model of memristor with nonlinear dopant drift," *Radioengineering* Jun. 2009:18(2):210-4.
Brumbach MT et al., "Evaluating tantalum oxide stoichiometry and oxidation states for optimal memristor performance," *J. Vac. Sci. Technol. A* 2014;32(5):051403 (7 pp.).
Burr GW, "Overview of candidate device technologies for storage-class memory," *IBM J. Res. Develop.* Jul. 2008;52(4.5):449-64.
Cabrera N et al., "Theory of the oxidation of metals," *Rep. Prog. Phys.* 1949;12:163-84.
Chang T et al., "Short-term memory to long-term memory transition in a nanoscale memristor," *ACS Nano* 2011;5(9):7669-76.
Chen JY et al., "Dynamic evolution of conducting nanofilament in resistive switching memories," *Nano Lett.* Jul. 2013;13:3671-7.
Chua LO et al., "Memristive devices and systems," *Proc. IEEE* Feb. 1976;64(2):209-23.
Chua LO, "Memristor—The missing circuit element," *IEEE Trans. Circuit Theory* Sep. 1971;18(5):507-19.
Dieny B et al., "Emerging non-volatile memories: magnetic and resistive technologies," *J. Phys. D: Appl. Phys.* 2013;46(7):070301 (1 p.).
Duan L et al., "Periodicity and dissipativity for memristor-based mixed time-varying delayed neural networks via differential inclusions," *Neural Networks* Sep. 2014;57:12-22.
Gao L et al., "Programmable CMOS/memristor threshold logic," *IEEE Trans. Nanotechnol.* Jan. 2013;12(2):115-9.
Gao XM et al, "An innovative sensing architecture for multilevel Flash memory," 2012 *IEEE 11th Int'l Conf. on Solid-State and Integrated Circuit Technol. (ICSICT)*, held on Oct. 29, 2012-Nov. 1, 2012, in Xi'an, pp. 1-3.
Garcia V et al., "Electronics: Inside story of ferroelectric memories," *Nature* Mar. 2012;483:279-81.
Hopkins PE, "Thermal transport across solid interfaces with nanoscale imperfections: Effects of roughness, disorder, dislocations, and bonding on thermal boundary conductance," *ISRN Mech. Eng.* 2013:682586 (19 pp.).
Ielmini D et al., "Evidence for voltage-driven set/reset processes in bipolar switching RRAM," *IEEE Trans. Electron Devices* Aug. 2012;59(8):2049-56.
Ielmini D, "Reliability issues and modeling of Flash and post-Flash memory," *Microelectron. Eng.* Sep.-Jul. 2009;86(7-9):1870-5.
Indiveri G et al., "Integration of nanoscale memristor synapses in neuromorphic computing architectures," *Nanotechnology* 2013;24(38):384010 (13 pp.).
James CD et al., "A comprehensive approach to decipher biological computation to achieve next generation high-performance exascale computing," *Sandia Report SAND2013-7915*, Oct. 2013 (105 pp.).
Jo SH et al., "Nanoscale memristor device as synapse in neuromorphic systems," *Nano Lett.* 2010;10:1297-301.
Ju SH et al., "Investigation on interfacial thermal resistance and phonon scattering at twist boundary of silicon," *J. Appl. Phys.* 2013;113:053513 (7 pp.).
Kim H et al., "Memristor-based multilevel memory," 2010 *12th Int'l Workshop on Cellular Nanoscale Networks and Their Applications (CNNA)*, held on Feb. 3-5, 2010, in Berkeley, CA, pp. 1-6.
Kim KH et al., "A functional hybrid memristor crossbar-array/CMOS system for data storage and neuromorphic applications," *Nano Lett.* 2012;12:389-95.
Kim KM et al., "The conical shape filament growth model in unipolar resistance switching of $TiO_2$ thin film," *Appl. Phys. Lett.* 2009;94:122109 (3 pp.).
Kvatinsky S et al., "TEAM: ThrEshold adaptive memristor model," *IEEE Trans. Circuits Syst.* Jan. 2013;60(1):211-21.
Kwon DH et al., "Atomic structure of conducting nanofilaments in $TiO_2$ resistive switching memory," *Nat. Nanotechnol.* 2010;5(2):148-53.
Larentis S et al. "Filament diffusion model for simulating reset and retention processes in RRAM," *Microelectron. Eng.* Jul. 2011;88(7):1119-23.
Larentis S et al., "Resistive switching by voltage-driven ion migration in bipolar RRAM—Part II: Modeling," *IEEE Trans. Electron Devices* Sep. 2012;59(9):2468-75.
Lee HY et al., "Low power and high speed bipolar switching with a thin reactive Ti buffer layer in robust $HfO_2$ based RRAM," *IEEE Int'l Electron Devices Meeting (IEDM)*, held on Dec. 15-17, 2008, in San Francisco, CA (pp. 1-4).
Lee J et al., "Diode-less nano-scale $ZrO_x/HfO_x$ RRAM device with excellent switching uniformity and reliability for high-density cross-point memory applications," *IEEE Int'l Electron Dev. Meeting (IEDM)*, held on Dec. 6-8, 2010 in San Francisco, CA, pp. 19.15.1-19.15.4.
Lee MJ et al., "A fast, high-endurance and scalable non-volatile memory device made from asymmetric $Ta_2O_{5-x}/TaO_{2-x}$ bilayer structures," *Nat. Mater.* Jul. 2011;10:625-30.
Li H et al., "A SPICE model of resistive random access memory for large-scale memory array simulation," *IEEE Electron Device Lett.* Feb. 2014;35(2):211-3.
Linn E et al., "Complementary resistive switches for passive nanocrossbar memories," *Nat. Mater.* 2010;9:403-6.
Liu Q et al., "Controllable growth of nanoscale conductive filaments in solid-electrolyte-based ReRAM by using a metal nanocrystal covered bottom electrode," *ACS Nano* 2010;4(10):6162-8.
Lohn AJ et al., "A CMOS compatible, forming free $TaO_x$ ReRAM," *ECS Trans.* 2013;58(5):5965.
Lohn AJ et al., "Analytical estimations for thermal crosstalk, retention, and scaling limits in filamentary resistive memory," *J. Appl. Phys.* 2014;115:234507 (7 pp.).
Lohn AJ et al., "Degenerate resistive switching and ultrahigh density storage in resistive memory," arXiv:1406.4033 [cond-mat.mtrl-sci], accessible from http://arxiv.org/abs/1406.4033 (15 pp.).
Lohn AJ et al., "Degenerate resistive switching and ultrahigh density storage in resistive memory," *Appl. Phys. Lett.* 2014;105:103501 (2014) (5 pp.).
Lohn AJ et al., "Dynamics of percolative breakdown mechanism in tantalum oxide resistive switching," *Appl. Phys. Lett.* 2013;103:173503 (4 pp.).
Lohn AJ et al., "Mechanism of electrical shorting failure mode in resistive switching," *J. Appl. Phys.* 2014;116:034506 (5 pp.).
Lohn AJ et al., "Memristors as synapses in artificial neural networks: Biomimicry beyond weight change," Chapter 9, *Cybersecurity Systems for Human Cognition Augmentation*, RE Pino et al. (eds.), Springer Int'l Publishing, Switzerland, 2014, pp. 135-150.
Lohn AJ et al., "Modeling of filamentary resistive memory by concentric cylinders with variable conductivity," *Appl. Phys. Lett.* 2014;105:183511 (5 pp.).
Lohn AJ et al., "Optimizing $TaO_x$ memristor performance and consistency within the reactive sputtering "forbidden region"," *Appl. Phys. Lett.* 2013;103:063502 (4 pp.).
Lohn AJ et al., "Stages of switching in tantalum oxide memristor," *IEEE Int'l Memory Workshop*, held May 26-29, 2013 in Monterey, CA (4 pp.).

(56) References Cited

OTHER PUBLICATIONS

Lu YM et al., "Impact of Joule heating on the microstructure of nanoscale TiO$_2$ resistive switching devices," *J. Appl. Phys.* 2013;113(16):163703 (9 pp.).
Manem H et al., "A read-monitored write circuit for 1T1M multi-level memristor memories," 2011 *IEEE Int'l Symp. on Circuits and Systems (ISCAS)*, held on May 15-18, 2011 in Rio de Janeiro, pp. 2938-2941.
Miao F et al., "Anatomy of a nanoscale conduction channel reveals the mechanism of a high-performance memristor," *Adv. Mater.* Dec. 2011;23(47):5633-40.
Miao F et al., "Continuous electrical tuning of the chemical composition of TaO$_x$-based memristors," *ACS Nano* 2012;6(3):2312-8.
Mickel PR et al., "A physical model of switching dynamics in tantalum oxide memristive devices," *Appl. Phys. Lett.* 2013;102:223502 (5 pp.).
Mickel PR et al., "Detection and characterization of multi-filament evolution during resistive switching," *Appl. Phys. Let..* 2014;105:053503 (4 pp.).
Mickel PR et al., "Isothermal switching and detailed filament evolution in memristive systems," *Adv. Mater.* 2014;26:4486-90.
Mickel PR et al., Supporting Information for "Isothermal switching and detailed filament evolution in memristive systems," *Adv. Mater.* 2014;26:4486-90 (8 pp.).
Mickel PR et al., "Memristive switching: Physical mechanisms and applications," *Mod. Phys. Lett. B* Apr. 2014;28(10):1430003 (25 pp.).
Mickel PR et al., "Multilayer memristive/memcapacitive devices with engineered conduction fronts," *Eur. Phys. J. Appl. Phys.* 2013;62:30102 (6 pp.).
Moore GE, "Cramming more components onto integrated circuits," *Proc. of the IEEE* Jan. 1998;86(1):82-5.
Muthuswamy B et al., "Memristor-based chaotic circuits," *IETE Tech. Rev.* Nov.-Dec. 2009;26(6):417 (16 pp.).
Nardi F et al., "Resistive switching by voltage-driven ion migration in bipolar RRAM—Part I: Experimental study," *IEEE Trans. Electron Dev.* Sep. 2012;59(9):2461-7.
Panagopoulos G et al., "Exploring variability and reliability of multi-level STT-MRAM cells," 2012 *70th Annual Dev. Res. Conf. (DRC)*, held on Jun. 18-20, 2012 at University Park, TX, p. 139-140.
Park GS et al., "In situ observation of filamentary conducting channels in an asymmetric Ta$_2$O$_{5-x}$/TaO$_{2-x}$ bilayer structure," *Nat. Commun.* Sep. 2013;4:2382 (9 pp.).
Park J et al., "Resistive switching characteristics of ultra-thin TiO$_x$," *Microelectron. Eng.* 2011;88:1136-9.
Pershin YV et al., "Experimental demonstration of associative memory with memristive neural networks," *Neural Networks* 2010;23:881-6.
Pickett MD et al., "A scalable neuristor built with Mott memristors," *Nat. Mater.* 2013;12:114-7.
Pickett MD et al., "Switching dynamics in titanium dioxide memristive devices," *J. Appl. Phys.* 2009;106:074508 (6 pp.).
Puglisi FM et al., "Random telegraph signal noise properties of HfOx RRAM in high resistive state," *Proc. of the Europ. Solid-State Dev. Res. Conf.*, held on Sep. 17-21, 2012 in Bordeaux, France, pp. 274-277.
Radwan AG et al., "HP memristor mathematical model for periodic signals and DC," *IEEE Int'l Midwest Symp. on Circuits and Systems*, held on Aug. 1-4, 2010 in Seattle, WA, pp. 861-864.
Rajendran J et al., "An energy-efficient memristive threshold logic circuit," *IEEE Trans. Comput.* Apr. 2012;61(4):474-87.
Savchenko IV et al., "Thermal conductivity and thermal diffusivity of tantalum in the temperature range from 293 to 1800 K," *Thermophys. Aeromech.* Dec. 2008;15(4):679-82.
Stevens JE et al., "Reactive sputtering of substoichiometric Ta$_2$O$_x$ for resistive memory applications," *J. Vac. Sci. Technol. A* Mar./Apr. 2014;32(2):021501 (6 pp.).
Strachan JP et al., "Measuring the switching dynamics and energy efficiency of tantalum oxide memristors," *Nanotechnology* 2011;22:505402 (5 pp.).
Stranz A et al., "Thermoelectric properties of high-doped silicon from room temperature to 900 K," *J. Electron. Mater.* Jul. 2013;42(7):2381-7.
Strukov DB et al., "Exponential ionic drift: fast switching and low volatility of thin-film memristors," *Appl. Phys. A* 2009;94(3):515-9.
Strukov DB et al., "The missing memristor found," *Nature* May 2008;453:80-3.
Strukov DB et al., "Thermophoresis/diffusion as a plausible mechanism for unipolar resistive switching in metal-oxide-metal memristors," *Appl. Phys. A* 2012;107:509-18.
Taylor RE et al., "Thermal conductivity of titanium carbide, zirconium carbide and titanium nitride at high temperatures," *J. Am. Ceram. Soc.* Feb. 1964;47(2):69-73.
Terai M et al., "Memory-state dependence of random telegraph noise of Ta$_2$O$_5$/Ti$_2$ stack ReRAM," *IEEE Electron Dev. Lett.* Nov. 2010;31(11):1302-4.
Torrezan AC et al., "Sub-nanosecond switching of a tantalum oxide memristor," *Nanotechnology* 2011;22(48):485203 (7 pp.).
Waser R et al., "Nanoionics-based resistive switching memories," *Nat. Mater.* 2007;6(11):833-40.
Waser R et al., "Redox-based resistive switching memories—nanoionic mechanisms, prospects, and challenges," *Adv. Mater.* 2009;21(25-26):2632-63.
Wei Z et al., "Retention model for high-density ReRAM," 4th *IEEE Int'l Memory Workshop (IMW)*, held on May 20-23, 2012 in Milan (pp. 1-4).
Wong HSP et al., "Metal-oxide RRAM," *Proc. IEEE* Jun. 2012;100(6):1951-70.
Yang JJ et al., "Engineering nonlinearity into memristors for passive crossbar applications," *Appl. Phys. Lett.* 2012;100:113501 (4 pp.).
Yang JJ et al., "Memristive devices for computing," *Nat. Nanotechnol.* 2013;8(1):13-24.
Yang JJ et al., Supplementary Information for "Memristive devices for computing," *Nat. Nanotechnol.* 2013;8(1):13-24 (10 pp.).
Yang JJ et al., "Metal oxide memories based on thermochemical and valence change mechanisms," *MRS Bull.* Feb. 2012;37:131-7.
Yu S et al., "Investigating the switching dynamics and multilevel capability of bipolar metal oxide resistive switching memory," *Appl. Phys. Lett.* 2011;98:103514 (3 pp.).
Zhang Z et al., "Nanometer-scale HfO$_x$ RRAM," *IEEE Electron. Device Lett.* Jul. 2013;34(8):1005-7.

\* cited by examiner

METHODS FOR RESISTIVE SWITCHING OF MEMRISTORS

CROSS-REFERENCE TO RELATED APPLICATION

This application is a continuation-in-part of prior U.S. application Ser. No. 14/462,472, filed Aug. 18, 2014, which in turn claims the benefit of U.S. Provisional Application No. 61/866,690, filed Aug. 16, 2013, each of which is hereby incorporated by reference in its entirety.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

REFERENCE TO A COMPUTER PROGRAM LISTING APPENDIX

A computer program listing appendix including an ASCII formatted file accompanies this application. The appendix includes a file named "SD13146_Appendix.txt," created on Dec. 23, 2014 (size of 21.9 kilobytes), which is hereby incorporated by reference in its entirety.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention is directed generally to resistive random-access memory (RRAM or ReRAM) devices and systems, as well as methods of employing a thermal resistive model to understand and determine switching of such devices.

BACKGROUND OF THE INVENTION

Memristors (also known as ReRAMs) have been proposed among the leading candidates for high density storage of information. Understanding the physical mechanisms that govern memristive switching has become a field of intense research. In particular, such physical mechanisms are difficult to measure experimentally. For instance, transmission electron microscopy studies are the de facto characterization technique but typically only provide a single, post-mortem filament state snapshot. Furthermore, despite its fundamental importance, filament temperature evolution is all but unknown experimentally. Accordingly, additional methods to understand resistive states and filament states are desired.

SUMMARY OF THE INVENTION

The present invention relates to methods for operating one or more resistive memory devices (or memristors). A memristor is composed of an insulator and is configured to support a conductive filament within this insulator. Typically, a memristor possesses an ON state and an OFF state, and each state can be described by at least one state variable (e.g., a low resistance state corresponding to the ON state, and a high resistance state corresponding to the OFF state). In particular, these states, as well as switching characteristics between states, can be measured by a current-voltage (I-V) or a power-resistance (P-R) measurement of the memristive device.

The device state (e.g., an ON state, OFF state, ON switching state, and/or OFF switching state) and/or the filament state (e.g., filament conductivity or filament radius) are difficult, if not impossible, to determine experimentally. Thus, models are useful in order to understand one or more parameters of the memory device. Accordingly, the present methods relate to such models. In one exemplary method, the models can be employed to fit I-V or P-R loops and to determine one or more fitting values corresponding to a device state (e.g., thereby reading a memory state of the device). In other embodiments, such a model would be very desirable because it would enable the recorded state of a processed or partially processed memristor to be fully characterized from a few simple measurements and, thus, would simplify the grading of manufactured memristors as well as their corrective post-processing.

Accordingly, in a first aspect, the invention features a method for operating a resistive memory device. In some embodiment, the method includes: providing a resistive memory device configured to provide a first filament disposed within the device, where the device is coupled to a monitoring apparatus; generating a P-R and/or an I-V measurement for the device by employing the monitoring apparatus; and applying an isothermal model to the P-R and/or I-V measurement in order to determine one or more parameters of the device (e.g., one or more parameters of the first filament, such as any parameter or state variable described herein).

In some embodiments, the P-R measurement is a P-R loop. In other embodiments, the P-R measurement includes a converted I-V measurement (e.g., a converted I-V loop). In yet other embodiments, the I-V measurement includes an I-V loop.

In some embodiments, the generating step includes performing a sweep or series of applied power $P_{app}$ to the device; and monitoring a resistance R of the device during the sweep or series. In other embodiments, the generating step includes performing a sweep or series of applied voltage $V_{app}$ (e.g., a series of discrete voltage pulses $V_{pulse}$) or applied current $I_{app}$ to the device; and monitoring a resistance R or a current I of the device during the sweep or series. In yet other embodiments, the generating step further includes converting the measured I and/or R values into the P-R measurement.

Accordingly, in a second aspect, the invention features a method for characterizing a resistive memory device. In some embodiments, the method includes obtaining a P-R and/or an I-V measurement for the device, where the device is configured to provide a first filament disposed within the device; and applying an isothermal model to the measurement (e.g., the P-R and/or I-V measurement) in order to determine one or more parameters of the device.

In any embodiment herein, the isothermal model includes a steady state heat flow model of the filament. In further embodiments, the steady state heat flow model includes: a radial heat flow component characterized by heat flow away from the filament and radially into the insulator surrounding the filament; and a vertical heat flow component characterized by heat flow away from the filament and through the reactive electrode. In other embodiments, the steady state heat flow model includes any equation described herein (e.g., one or more of Eqs. 1-24, such as Eq. 1, 2a-2b, 7, 8, 10, 11, 12, 13, 14a-14b, 15a-15b, 16, 17, 21a-21c, 22, 23, and/or 24).

In any embodiment herein, the applying step includes: providing the isothermal model for ON switching, which is expressed as any equation described herein (e.g., one or more of Eqs. 1-24, such as Eq. 1, 2a-2b, 7, 8, 9a-9b, 10, 13, 14a-14b, 15a-15b, 16, 17, 21a-21c, 22, and/or 23); and determining a fitting value (e.g., the fitting value for each of $T_{crit}$, $k_E$, and/or $\sigma_{max}$) as applied to an ON switching curve of the P-R measurement or loop. In other embodiments, the applying step further includes: generating a simulated ON switching curve based on Eq. 1, 2a, 13, and/or 14a and based on one or more fitting values (e.g., a fitting value for each of $T_{crit}$, $k_E$, and/or $\sigma_{max}$). In yet other embodiments, $T_{crit}$ is of from about 1300 K to about 1800 K, $k_E$ is of from about 50 W $M^{-1}K^{-1}$ to about 300 W $M^{-1}K^{-1}$, and $\sigma_{max}$ is of from about $6\times10^4$ $\omega^{-1}$ $m^{-1}$ to about $9\times10^5$ $\Omega^{-1}$ $m^{-1}$.

In any embodiment herein, the applying step includes: providing the isothermal model for OFF switching, which is expressed as any equation described herein (e.g., one or more of Eqs. 1-24, such as Eq. 1, 2a-2b, 7, 8, 9a-9b, 10, 13, 14a-14b, 15a-15b, 16, 17, 21a-21c, 22, and/or 23); and determining a fitting value (e.g., the fitting value for each of $T_{crit}$, $k_E$, and/or $r_{max}$) as applied to an OFF switching curve of the P-R measurement or loop.

In any embodiment herein, the applying step further includes: generating a simulated OFF switching curve based on Eq. 1, 2b, 13, and/or 14b and based on one or more fitting values (e.g., a fitting value for each of $T_{crit}$, $k_E$, and/or $r_{max}$). In yet other embodiments, $T_{crit}$ is of from about 1300 K to about 1800 K, $k_E$ is of from about 50 W $M^{-1}K^{-1}$ to about 300 W $M^{-1}K^{-1}$, and $r_{max}$ is of from 5 nm to about 20 nm.

In any embodiment herein, the applying step results in reading an ON state and/or an OFF state of the first filament.

In any embodiment herein, the generating step includes reading the state of the $n^{th}$ filament. In some embodiments, the reading step includes: performing a sweep of applied power $P_{app}$ to the $n^{th}$ filament of the device and monitoring a resistance of the device during the sweep, where a change in resistance is indicated as the resistance setpoint $R_{sp}$. In any embodiment herein, $P_{app}$ corresponds to $P_n$, and $R_{sp}$ corresponds to $R_n$.

In any embodiment herein, the applying step includes employing a set of concentric shells, where each shell has a conductivity $\sigma$. In further embodiments, the applying step includes providing a set of concentric shells, where each shell has a conductivity $\sigma$ and where the set represents the forming filament within the memristive device; and calculating the conductivity $\sigma$ of each shell using any useful equation (e.g., Eq. 11 or 24 herein, where variable C is allowed to vary). In yet further embodiments, the applying step further includes incrementing the number of saturated shells in the set until ON switching is satisfied (e.g., as provided by Eq. 14a herein). In yet other embodiments, the applying step further includes decrementing the concentration of one or more shells in the set with the highest concentration until OFF switching is satisfied (e.g., as provided by Eq. 14b herein).

In any embodiment herein, the one or more parameters includes a filament composition $\sigma$ (e.g., a conductivity of the filament in the ON state); a filament radius r (e.g., a radius of the filament during ON switching and/or OFF switching); a surrounding thermal resistance k (e.g., resistance of the reactive electrode); a saturation conductivity of the ON state $\sigma_{max}$; electrode thermal conductivity $k_E$; a device temperature (e.g., a critical activating temperature $T_{drit}$); a filament temperature; a power threshold; a simulated ON switching curve; and/or a simulated OFF switching curve.

In any embodiment herein, the device includes a reactive electrode and an insulator configured to provide a first filament disposed within the insulator. In further embodiments, the device includes a reactive electrode, an inert electrode, and an insulator, where the inert and reactive electrodes are disposed on opposing sides of the insulator. In yet other embodiments, one or more electrodes comprise silicon (e.g., doped silicon).

In any embodiment herein, the device is a resistive memory device. In some embodiments, the resistive memory device has a reactive electrode and a conductive filament. The state variables of the filament can be set by any useful manner, such as by applying an electric power in a first sweep, with positive polarity on the reactive electrode, until a first desired stopping point $P_{R1}$ is reached; and then with negative polarity on the reactive electrode, applying an electric power in a second sweep until a first desired set point $P_{C1}$ is reached. In other embodiments, $P_{R1}$ establishes a first filament radius $r_1$ as one state variable; $P_{C1}$ established a first conductivity $\sigma_1$ as a second state variable; and/or each of $P_{R1}$ and $P_{C1}$, together, establishes a first power-resistance angle $\theta_1$ as a third state variable, where $\theta_1$ denotes a slope of $\delta P/\delta R$. In some embodiments, $P_{R1}$ of the first sweep determines which (R, P) storage coordinates will be accessible in the second sweep.

In embodiment herein, the filament is characterized by a combination of state variables (e.g., $<r_n, \sigma_n>$ or $<r_n, \sigma_n, \theta_n>$ for the $n^{th}$ filament or device) and corresponding storage coordinates (e.g., $(R_n, P_n)$ or $(R_n, P_n, \delta P_n/\delta R_n)$ for the $n^{th}$ filament or device). In one embodiment, the combination of state variables $<r_1, \sigma_1>$ corresponds to a $(R_1, P_1)$ storage coordinate, where $R_1$ denotes a resistance of the first filament or device and $P_1$ denotes an applied power needed to begin changing the resistance of the first filament or device. In another embodiment, a combination of state variables $<r_2, \sigma_2, \theta_2>$ corresponds to a $(R_2, P_2, \delta P_2/\delta R_2)$ storage coordinate, where $R_2$ denotes a resistance of the second filament or device, $P_2$ denotes an applied power needed to begin changing the resistance of the second filament or device, and $\delta P_2/\delta R_2$ denotes a slope of a change in applied power over a change in resistance. In other embodiments, a combination of state variables $<r_n, \sigma_n>$ or $<r_n, \sigma_n, \theta_n>$ corresponds to a set of distinct (R, P) coordinates (i.e., a set of $(r_{n-i}, p_{n-i})$) for each data curve; a slope $\delta P_n/\delta R_n$; and/or a fit $f_n(R, P)$. In any embodiment herein, $R_1 \neq R_2$ and/or $P_1 \neq P_2$. In other embodiments, $R_1=R_2$ or $P_1=P_2$.

In any embodiment herein, the device is a memory including a plurality of m resistive memory devices (e.g., where m is an integer more than one). In some embodiments, each said device contains a respective stored data value embodied in a set of two or more state variables, where the state variables include a combination of state variables $<r_n, \sigma_n>$ for each $n^{th}$ filament (e.g., where n is an integer more than one) in each $m^{th}$ device, $r_n$ denotes a filament radius for the $n^{th}$ filament, and $\sigma_n$ denotes a conductivity for the $n^{th}$ filament. In other embodiments, each $<r_n, \sigma_n>$ corresponds to a $(R_n, P_n)$ storage coordinate, where $R_n$ denotes a resistance of the $m^{th}$ device having the $n^{th}$ filament, and $P_n$ denotes an applied power needed to begin changing the resistance of the $n^{th}$ device. In yet other embodiments, the state variables include a combination of $<r_n, \sigma_n, \theta_n>$ for each $n^{th}$ filament in each $m^{th}$ device and $\theta_n$ denotes a power-resistance angle for the $n^{th}$ filament, where each $<r_n, \sigma_n, \theta_n>$ corresponds to a $(R_n, P_n, \delta P_n/\delta R_n)$ storage coordinate and $\delta P_n/\delta R_n$ denotes a slope of a change in applied power over a change in resistance for the $n^{th}$ filament.

In any embodiment herein, the method is employed to operate, read, write, and/or characterize a system including: at least one resistive memory device having a reactive electrode; a monitoring device configured to measure and to indicate the electrical resistance of the device; and a controllable power source configured, in response to the inputting of data for storage, to perform any method described herein.

DEFINITIONS

As used herein, the term "about" means+/−10% of any recited value. As used herein, this term modifies any recited value, range of values, or endpoints of one or more ranges.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

BRIEF DESCRIPTION OF THE DRAWINGS

In FIG. 4B, the reactive electrodes are tantalum (e.g., Ta having $d_E$ of about 50 nm to about 100 nm), the inert electrodes are platinum, and the insulator is tantalum oxide (e.g., TaO$_x$ having $d_O$ of about 5 nm to about 30 nm).

DETAILED DESCRIPTION OF THE INVENTION

Figure 1A:
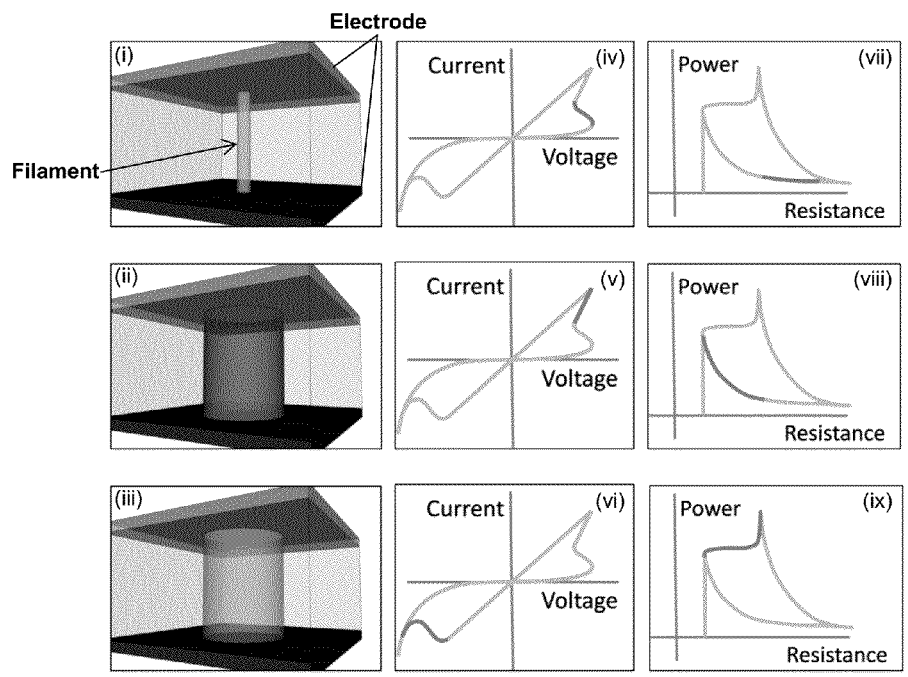
FIG. 1A-1B shows the relationship between conductive filament formation, measurements in current-voltage (I-V) coordinates, and measurements in power-resistance (P-R) coordinates. (A) Provided are schematics for the conductive filament (i-iii), which can be equivalently represented in either (iv-vi) I-V coordinates or (vii-ix) P-R coordinates. (B) Provided is a schematic showing the relationship between state variables $<r_n, \sigma_n>$ for each $n^{th}$ configuration and its corresponding measurable resistance-power $(R_n, P_n)$ storage coordinate, where n=1 for the first filament or first device.

The present invention relates to methods that employ a steady state, isothermal model to understand switching behavior and states of filaments within memristors. In particular, the model is time-independent, thereby providing a simplified model that need not require intensive computing power. By employing the methods herein, the memristor state (e.g., a memory storage state, such as an ON or OFF state) can be read in a simple manner. A memristor state can be characterized by any parameter described herein, such as a filament composition $\sigma$, a filament radius r, a surrounding thermal resistance k, a saturation conductivity of the ON state $\sigma_{max}$, electrode thermal conductivity $k_E$, a critical activating temperature $T_{crit}$, a filament temperature, a power threshold, a simulated ON switching curve, and/or a simulated OFF switching curve.

Resistive Memory Devices (Memristors)

The present invention relates to methods to operate (e.g., use, characterize, or process) a memristor. Memristors include one or more nanoscale conduction channels (or filaments) disposed within an insulator and disposed between two electrodes (e.g., between an active electrode and an inert electrode). The filament is conductive and thus, when fully formed between the electrodes, provides a low resistance state (or an ON state). In general, memristors do not have a conductive filament in the as-fabricated state. Usually, one or more electroforming steps are performed by exposing the memristor to an initial DC voltage stress, which induces dielectric breakdown across the insulator and forms a conductive path through the insulator.

Memristors display unique electrical properties. For instance, FIG. 1A(i)-(iii) shows schematics of an exemplary memristor having a filament disposed within an insulator and between two electrodes. This filament is shown schematically ((i)-(iii)), as well as in corresponding current-voltage (I-V) measurements (e.g., an I-V loop in FIG. 1A(iv)-(vi)) and power-resistance (P-R) measurements (e.g., a P-R loop in FIG. 1A(vii)-(ix)). Redrawing the I-V hysteresis loop in terms of P-R coordinates provides a more convenient basis than radius and conductivity. Starting from the high resistance state, positive polarity on the reactive top electrode causes a filament to increase conductivity (i, iv, vii) until saturation. Further increasing power with positive polarity causes the radius to increase (ii, v, viii), and reversing polarity causes conductivity to decrease (iii, vi, ix). In this way, filament state and device state can be set by controlling the applied power and polarity, and then deduced from correlated I-V and P-R measurements.

Electrical data (e.g., I-V and P-R measurements) can be directly converted between current-voltage and power-resistance coordinates via the following equations:

$$P = IV \quad \text{(Eq. 9a) and}$$

$$R = V/I \quad \text{(Eq. 9b),}$$

where P is power, I is current, V is voltage, and R is resistance. The physical process occurring within the device during switching is described in Mickel P R et al., *Adv. Mater.* 2014; 26:4486-90, which is incorporated herein by reference in its entirety.

By progressing through the I-V hysteresis loop (FIG. 1A(iv)-(vi)), the filament displays different geometry (e.g., filament radius $r_F$) and composition (e.g., conductivity σ, see FIG. 1A(i)-(iii)). Thus, by progressing through the I-V loop, filament formation can be tuned and controlled. When filament geometry and composition (e.g., radius $r_n$ and conductivity $\sigma_n$) are used as state variables employed to store information, then filament formation is called the writing or SET step. In addition, when the state variables provide measurable storage coordinates (e.g., a coordinate include one or more of resistance $R_n$, current $I_n$, voltage $V_n$, or power $P_n$), then determining these storage coordinates or parameters is called the READ step.

Figure 1B:
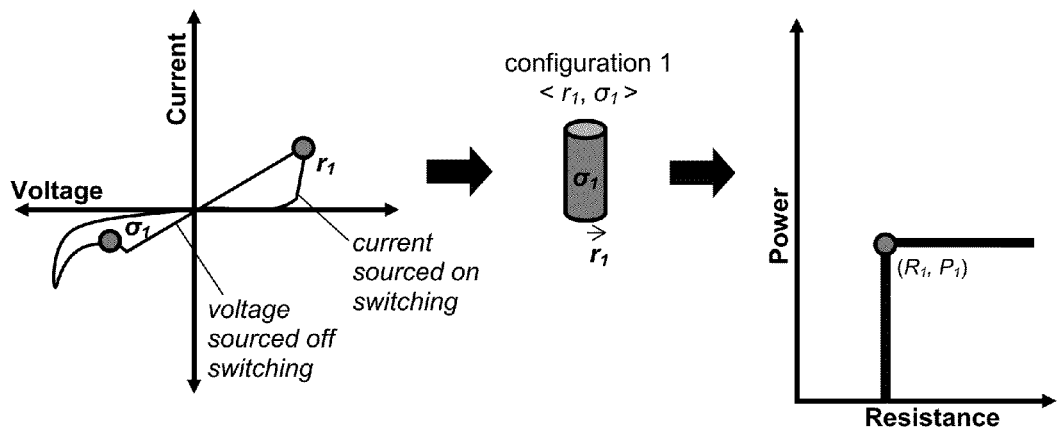

As seen in FIG. 1B, radius $r_n$ and conductivity $\sigma_n$ are two separate state variables that can be represented by a P-R measurement ($R_n$, $P_n$). By varying the positive power and negative power sequentially, various $r_n$ and $\sigma_n$ combinations can be set for the filament. For a first configuration $<r_1, \sigma_1>$, applying power with a positive polarity on the reactive electrode sets the filament radius $r_1$. In one embodiment, this power is applied by using current-sourced ON switching. For instance, increasing positive current (inert electrode grounded) is applied, thereby decreasing resistance and injecting oxygen vacancies from the reactive electrode until the concentration saturates. After saturation, further increases in positive current results in increasing the radius of the saturated region. When current is applied to a first desired stopping point $P_{R1}$, the filament radius $r_1$ is set (FIG. 1B, left).

To set conductivity $\sigma_1$, power with an opposite polarity is applied on the reactive electrode. In one embodiment, this power is applied by using voltage-sourced OFF switching. For instance, increasing negative voltage is applied, thereby increasing resistance and drawing oxygen vacancies back into the reactive electrode. Further increases in negative current result in decreasing conductivity. When voltage is applied to a first desired stopping point $P_{C1}$, the filament conductivity $\sigma_1$ is set (FIG. 1B, left). By progressing through the P-R loop and stopping at desired stopping points (e.g., $P_{C1}$ and $P_{R1}$), the desired configuration for the filament is set (FIG. 1B, center, where the configuration of the first filament includes a combination of $<r_1, \sigma_1>$).

In some embodiments, current-sourced ON switching is used to set the filament radius (P=I²R, with R decreasing), whereas voltage-sourced OFF switching is used to control the filament conductivity (P=V²/R, with R increasing). In some non-limiting instances, power-limited sourcing can be used for precision control, as negative feedback decreases the applied power and self-limits thermal activation, guaranteeing precise 'freezing' of resistive switching at the desired state-variable values.

The filament can be read or characterized by generating a P-R measurement for the device. In one instance, a P-R measurement includes a ($R_n$, $P_n$) storage coordinate (see, FIG. 1B, right). In one embodiment, the storage coordinate is measured by performing a sweep of applied power $P_{app}$ to the device and monitoring a resistance R of the device during the sweep, wherein a change in resistance is indicated as the resistance setpoint $R_{sp}$. In yet other embodiments, the storage coordinate is measured by performing a series of applied power $P_{app}$ to the device and monitoring a resistance R of the device during the series. Other methods of determining P-R measurements are described herein. The methods herein employ an isothermal model to determine the underlying state variables (e.g., parameters, such as any herein) reflected in the measurable P-R measurement or storage coordinate.

Isothermal Model for Resistive Switching

Figure 2A:
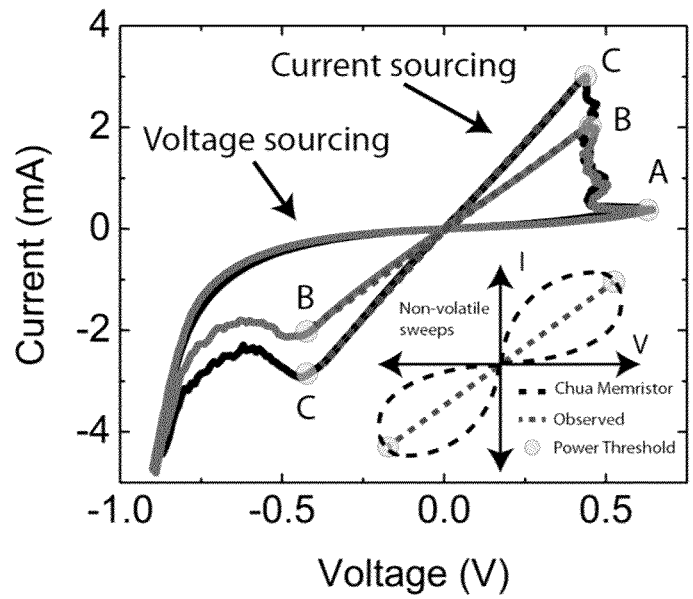
FIG. 2A-2C provides ON and OFF switching hysteresis curves that show evidence of isothermal switching. (A) I-V hysteresis curves are shown for two compliance current limits. Both hysteresis curves show sharp I-V end-points (labeled "A", "B", and "C"), in contrast to a canonical Chua memristor having smooth endpoints (inset). (B) Multiple current-sourced ON switching curves with varying maximum current are shown. The sharp termination of switching with a decrease in current suggests the system is near a thermally activating temperature. The multiple hysteresis curves show that all switching points share the sharp termination, suggesting that all switching points share a common temperature (i.e., isothermal switching). Inset: a comparison to canonical Chua memristors is shown, highlighting the smooth end-points, and the absence of the experimentally observed non-perturbative voltage sweep range. (C) Multiple voltage-sourced OFF switching loops are shown, suggesting that OFF switching is also isothermal.
Figure 2B:
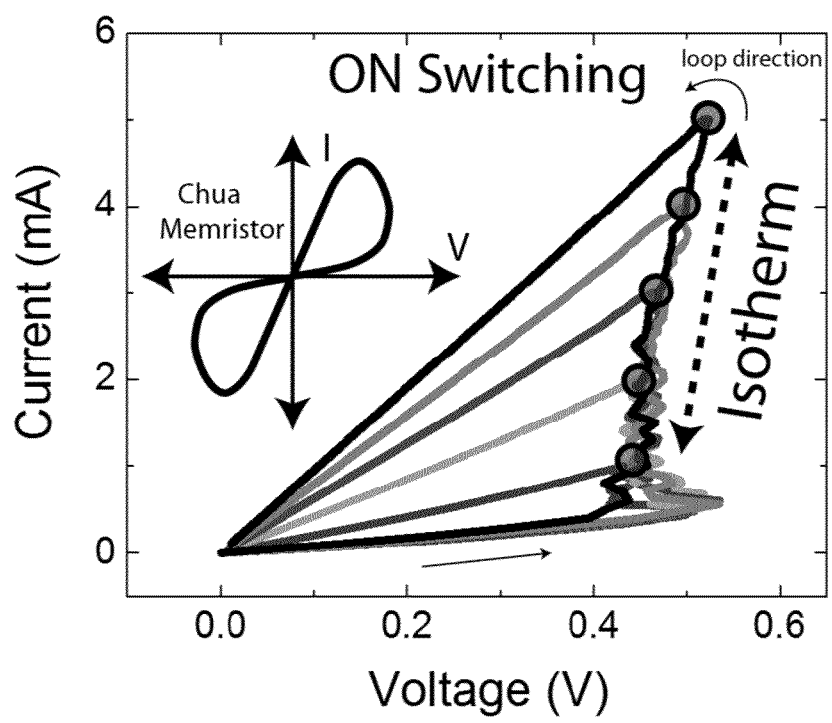
Figure 2C:
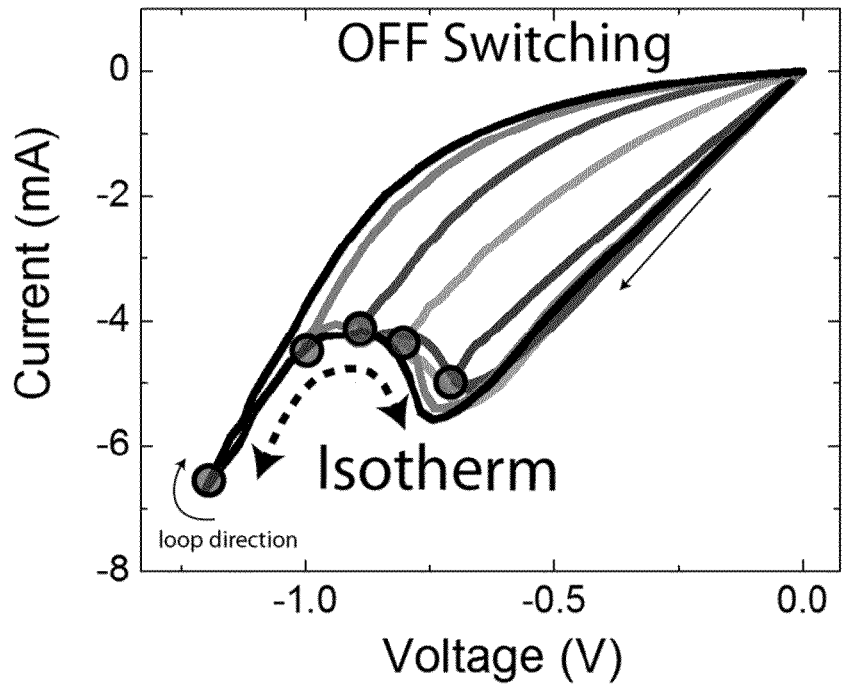

Switching of the memristor to ON and OFF states provides a conductive filament. As shown in FIG. 1A, the different states and switching can be represented on a P-R coordinate system or an I-V coordinate system. Memristor switching can be modeled as a thermally activated system. FIG. 2A shows hysteresis curves having two different I-V end-points (points "B" and "C"), where the resistive switching was current-limited for ON switching and voltage-limited for OFF switching. Ideally, memristors should display the canonical figure-8 switching curve, as shown in the inset of FIG. 2A. This canonical curve is rarely observed. Rather, as seen in FIG. 2A-2C, switching data usually display sharp end-points, suggesting a more dynamic process for filament switching.

Figure 3A:
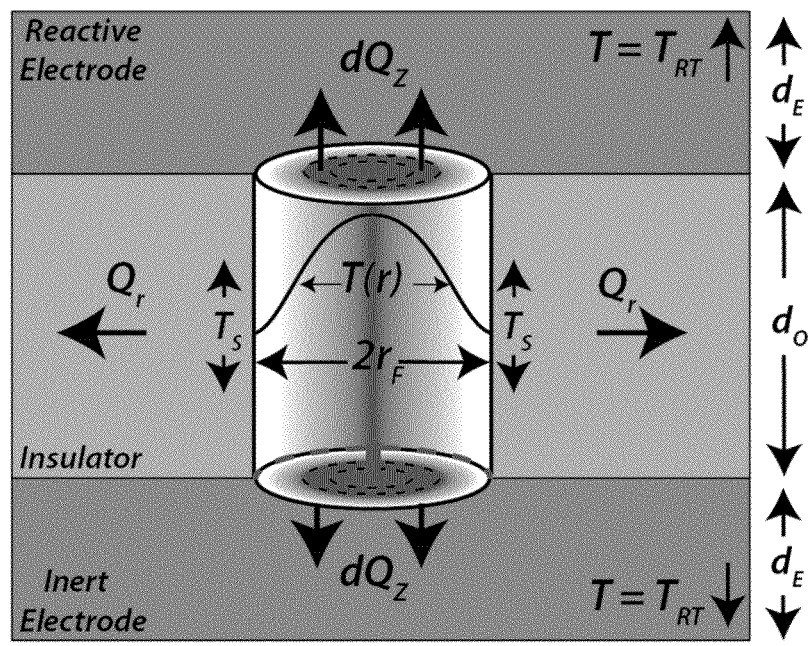
FIG. 3A-3B shows a thermal model and a comparison to resistive switching data. (A) Provided is a schematic of heat flow for a conducting filament of radius $r_F$ and uniform conductivity (or equivalently, oxygen vacancy concentration) in an insulating environment. Heat flow is decomposed into two components: $Q_r$ and $Q_z$, with $Q_{Tot}=Q_r+Q_z$. The temperature profile within the filament T(r) results in a spatially varying local $\hat{z}$ heat flow $dQ_z$, while the constant surface temperature $T_S$ results in a constant radial heat flow $Q_r$. $T_S$ is the temperature that remains constant during the isothermal switching depicted in FIG. 2B-2C. $d_O$ and $d_E$ are the oxide and electrode thicknesses, respectively. As shown, the boundary conditions assume the outer edge of the electrodes are held constant at room temperature $T_{RT}$. (B) Experimental data (black lines) and theoretically calculated fits (gray or white lines) for hysteresis loops are provided in two coordinate systems: the typical current-voltage basis (inset) and the power-resistance basis natural to the constitutive equations derived here. The loops are divided into four portions: ON switching (light gray solid line, Eq. 2a), ON state (dotted gray line, Ohmic conduction), OFF switching (dark gray solid line, Eq. 2b), and OFF state (dashed gray line, Ohmic and Poole-Frenkel conduction). The fitting parameters for the switching curves were as follows: $T_{crit}=1650$ K, $k_E=145.3$ W m$^{-1}$K$^{-1}$, and $\sigma_{max}=6.25e5$ $\Omega^{-1}$ m$^{-1}$. The OFF state was modeled according to the equation: $I(V)=V(a+be^{c\sqrt{v}})$, where $1/a=1.5$ k$\Omega$, $1/b=1.33$ M$\Omega$, and $c=7.8$ V$^{-1/2}$. ON and OFF state fits are shown in dashed lines, as they are not predicted by the switching model discussed herein.
Figure 3B:
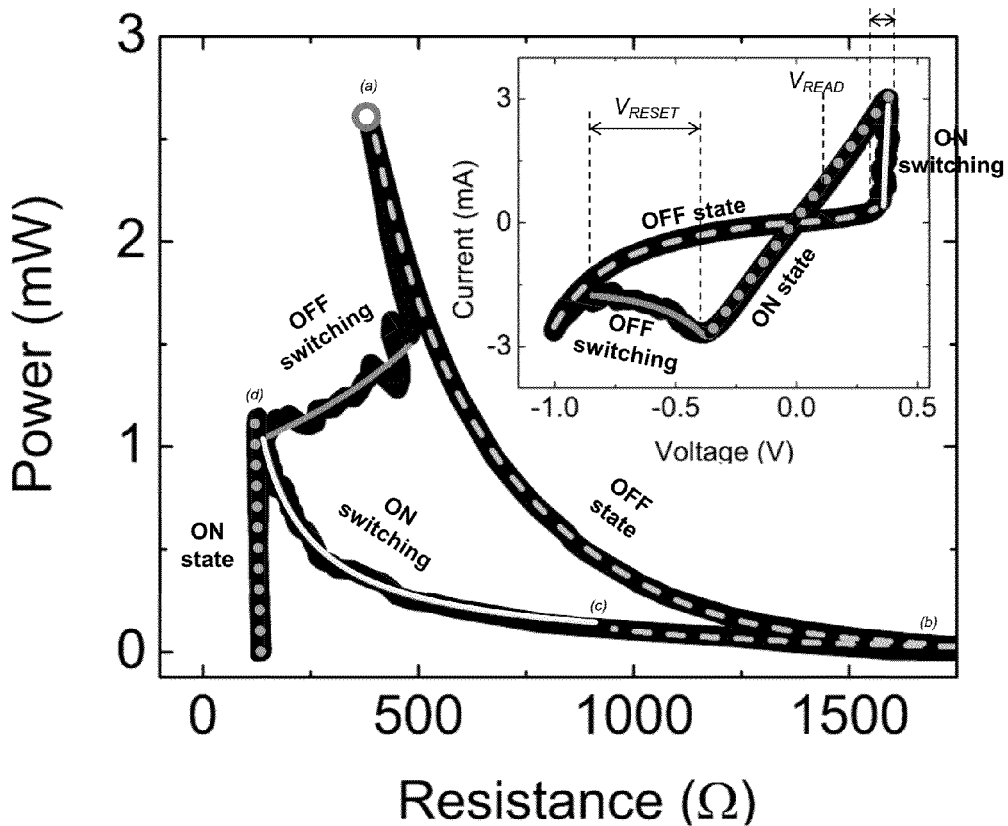

FIG. 3A provides a thermal model, which accurately describes the observed switching dynamics (see fits shown as gray lines in FIG. 3B). In brief, the thermal model is a steady state, time-independent model that compensates for Joule heat being generated and dispersed during filament formation. FIG. 5a-d provides a physical depiction of the microscopic ionic flux in multiple switching regimes described by the constitutive equations also described herein, including its ON switching (FIG. 5a), ON state (FIG. 5b), OFF switching (FIG. 5c), and OFF state (FIG. 5d). Additional details for this model and its constitutive equations are provided herein.

The resistive switching curve, and its dependence on each state variable, is described by the following equation:

$$P = \frac{\Delta T / R}{\dfrac{d_E \sigma}{2 k_E d_O} - \dfrac{r_F^2}{8 L_{WF} T_{crit} d_O^2}}, \quad \text{(Eq. 10)}$$

where P is the applied power required to activate resistive switching, $\Delta T$ is the difference between the ambient temperature T (e.g., room temperature $T_{RT}$) and the critical thermally-activating temperature $T_{crit}$, R is the electronic resistance, σ is electrical conductivity, $d_E$ is electrode thickness, $k_E$ is electrode thermal conductivity, $d_O$ is the thickness of the oxide insulator, $r_F$ is filament radius, and $L_{wF}$ is the Weidemann-Franz constant. Importantly, comparing to a single hysteresis curve can determine the unknown physical quantities at all switching points including any useful parameter, such as both state variables ($\sigma_n$ and $r_n$ for each $n^{th}$ filament) and the critical activating temperature ($T_{crit}$). In particular, Eq. 10 provides a useful equation to correlate observed P-R measurements with the isothermal model describing the filament state (e.g., as described by Eq. 1). In fact, Eq. 10 is a rewritten form of Eq. 1, where Eq. 1 is solved for $V^2$, divided by the resistance of the filament R (where P=IV=V²/R), and applying the Wiedemann-Franz law ($k_F = \sigma L_{WF} T_{crit}$) in order to arrive at Eq. 10. Any of the equations herein may be employed to describe the memristor state.

The models and its equations can be implemented in any useful manner. In one instance, the method includes applying an isothermal model with a numerical model (e.g., any herein, such as in Examples 5 and 6 herein, as well as in Lohn A J et al., "Modeling of filamentary resistive memory by concentric cylinders with variable conductivity," *Appl. Phys. Lett.* 2014; 105:183511, which is incorporated herein by reference in its entirety).

Power-Resistance Measurements

The present method includes generating a power-resistance (P-R) measurement for the memristor device employing any useful monitoring apparatus (e.g., a sourcemeter). P-R measurements can be determined in any useful manner. In one example, stored information is read by performing a sweep of applied power $P_{app}$ to the memristor device and monitoring a resistance R of the device during the sweep. In particular, when a change in resistance (indicated as the resistance setpoint $R_{sp}$) is observed, the power $P_{app}$ providing that $R_{sp}$ gives the storage coordinate $P_n$, and $R_{sp}$ is $R_n$. In this example, the $P_n$-$R_n$ storage coordinate is a power-resistance measurement for the $n^{th}$ filament (see, e.g., FIG. 1B). As described herein, in some embodiments, each storage coordinate $R_n$ and $P_n$ corresponds to a unique combination of state variables, e.g., $r_n$, $\sigma_n$, or any described herein.

In yet another embodiment, a P-R measurement can include a P-R loop (e.g., as seen in FIG. 1A(vii)-(ix)). Such a loop can be generated by performing a sweep or series of applied power $P_{app}$ to the device; and monitoring a resistance R of the device during the sweep or series. In some instances, a change in resistance is indicated as the resistance setpoint $R_{sp}$. In yet other instances, $P_{app}$ corresponds to $P_n$, and $R_{sp}$ corresponds to $R_n$. In some embodiments, the sweep can include a continuous change of applied power $P_{app}$, applied voltage $V_{app}$, or applied current $I_{app}$. In other embodiments, the series can include a plurality of pulses of applied power $P_{app}$, voltage $V_{pulse}$, or current $I_{pulse}$. The sweeps or series can be current-limited, voltage-limited, and/or power-controlled.

In other embodiments, the P-R measurement can be converted (e.g., by employing Eq. 9a-9b) from one or more resistance R, current I, or voltage V measurements. For instance, a sweep or series of applied voltage $V_{app}$ or applied current $I_{app}$ can be performed to the device; and a resistance R or a current I of the device can be monitored during the sweep or series.

Parameters, Including State Variables, and Storage Coordinates

The state of the device is controlled by the presence of the conductive filament, which is created upon switching the device. In turn, state variables describe one or more characteristics of the filament, and each bit of information includes a combination of one or more state variables. Storage coordinates are measurable values, and the value of the storage coordinates corresponds to particular state variables or particular combinations of state variables.

The device can be characterized by one or more measurable values, such as a P-R measurement (e.g., a P-R storage coordinate, such as an ($R_n$, $P_n$) for an $n^{th}$ filament, or a P-R loop), an I-V measurement (e.g., an I-V loop), a resistance $R_n$, a current $I_n$, a voltage $V_n$, or a power $P_n$ determined for each $n^{th}$ filament (e.g., upon applying a pump voltage, current, or power as a sweep or a series of discrete pulses). In particular embodiments, each storage coordinate (e.g., a ($R_n$, $P_n$) coordinate) reflects two or more physical characteristics of a conductive filament within a memristor device.

Any useful state variable(s) or combinations of such variables may be employed. Exemplary state variables include a filament composition, such as a filament conductivity $\sigma_n$ for an $n^{th}$ filament, a radial conductivity $\sigma_{r,n}$ for an $n^{th}$ filament at a radial position $\rho$ (e.g., where $\rho$ is any value between 0 (i.e., at the center of the filament) and $r_n$ (i.e., at the edge of the filament)), or a saturation conductivity of the ON state $\sigma_{max}$; a geometry of the filament, e.g., a filament radius $r_n$ for an $n^{th}$ filament, a graded distribution of radii for filament having a concentric set of q filaments each having a radius of $r_q$, a cylindrical filament having a radius $r_n$, or a cone-shaped filament having a base radius $r_{nb}$; a dynamic feature, e.g., a power-resistance angle $\theta_n$ for an $n^{th}$ filament; a surrounding thermal resistance k, e.g., electrode thermal conductivity $k_E$; a critical activating temperature $T_{crit}$; a power threshold, a simulated ON switching curve; and/or a simulated OFF switching curve.

Each state can be represented by one storage coordinate or a combination of a plurality of different storage coordinates, such as an ($R_n$, $P_n$) coordinate or a set of distinct (R, P) coordinates (i.e., a set of ($r_{n-i}$, $p_{n-i}$)) for each data curve. One or more of these storage coordinates may be employed to characterize a single bit of information.

Memory Resistors (Memristors) and Arrays Thereof

Figure 4A:
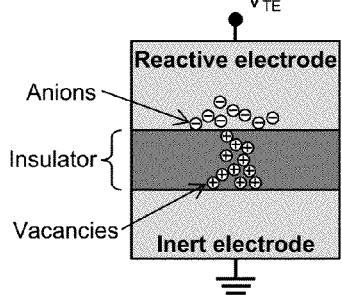
FIG. 4A-4B shows schematics of exemplary memristors.
Figure 4B:
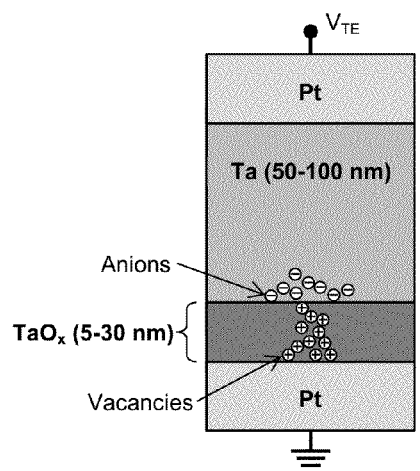

Any useful memristors and arrays thereof may be employed. For instance, the memristor can include a top electrode, a bottom electrode, and an insulator disposed between the top and bottom electrodes. In one embodiment, the memristor includes a reactive electrode, an inert electrode, and an insulator disposed between the top and bottom electrodes (FIG. 4A). In another embodiment, the memristor includes a reactive tantalum electrode, an inert platinum electrode, and a tantalum oxide insulator disposed between the top and bottom electrodes (FIG. 4B). The memristor can further include a third electrode disposed on top of the reactive electrode. Any useful architecture may be employed.

The methods herein can be employed for memristors formed from a broad range of materials. Exemplary memristors include bipolar switching memristors, including those described in Yang J J et al., "Memristive devices for computing," *Nat. Nanotechnol.* 2013 January; 8:13-24; Balatti S et al., *Adv. Mater.* 2013; 25:1474-8; Burr G W, *IBM J. Res. Develop.* 2008 July; 52(4.5):449-64; Chang T et al., *ACS Nano* 2011; 5(9):7669-76; U.S. Pat. Nos. 8,395,926 and 8,450,711; as well as U.S. Pub. Nos. 2011/0169136 and 2014/0027705, each of which is incorporated herein by reference in its entirety Any useful insulator capable of transporting vacancies, cations, and/or anions may be employed. Exemplary insulators include transition metal oxide (TMO) films containing mobile oxygen ions, metal cations, and/or oxygen vacancies, such as $TiO_2$, $Ta_2O_5$, $WO_3$, $HfO_2$, $ZrO_2$, $SrTiO_3$, $MoO_3$, NiO, $Al_2O_3$, AlNO, and $Nb_2O_5$. Other materials are described in Yang J J et al., *Nat. Nanotechnol.* 2013 January; 8:13-24 and Wong H S P et al., "Metal-oxide RRAM," *Proc. IEEE* 2012 June; 100(6):1951-70, each of which is incorporated herein by reference in its entirety.

Other insulators include $M_aO_b$, where M is a transition metal (e.g., a metal present in the resistive switching element); and each of a and b is, independently, an integer of from 1 to 5. In other embodiments, M is a transition metal (e.g., any in groups IV-X, such as Ti, Zr, Hf, V, Nb, Ta, Mo, W, Tc, Re, Co, Rh, Ir, Ni, Pd, or Pt). In yet other embodiments, the insulator includes $M_2O$, where M is a transition metal (e.g., any in groups IV-X, such as Ti, Zr, Hf, V, Nb, Ta, Mo, W, Tc, Re, Co, Rh, Ir, Ni, Pd, or Pt).

Electrodes can be formed from any useful material. In particular, a conductive element serves as an electrode and is typically made from electrically conductive metals (e.g., tungsten (W), tungsten nitride (WN), gold (Au), silver (Ag), copper (Cu), chromium (Cr), platinum (Pt), iridium (Ir), nickel (Ni), silicon (Si), silicon carbide (SiC), molybdenum (Mo), cobalt (Co), ruthenium (Ru), titanium (Ti), titanium nitride (TiN), titanium aluminum nitride (TiAlN), aluminum (Al), hafnium (Hf), strontium (Sr), tantalum (Ta), and tantalum nitride (TaN), as well as doped forms, alloy forms, amorphous forms, crystalline forms, and laminated forms thereof). Exemplary electrode pairs include an active electrode formed from an electrochemically active or oxygen reactive material (e.g., Ta) and an inert electrode formed from an electrochemically inert material (e.g., Pt). Other non-limiting electrochemically active or oxygen reactive materials include Ag, Cu, Ni, Ta, Hf, Ti, Sr, or alloys and combined forms thereof, such as CuTe, $SrRuO_3$, or TiN; and electrochemically inert materials include W, Pt, Au, Mo, Co, Cr, Ru, Ir, doped Si, poly-Si, TiW, TiN, or TaN.

The components of the device can be formed by any useful process. Exemplary processes include reactive sputtering, sputtering, chemical vapor deposition (CVD), pulse laser deposition (PLD), atomic layer deposition (ALD), gas cluster ion beam (e.g., as described in U.S. Pub. No. 2012/0104347, which is incorporated herein by reference in its entirety), photolithography, lift-off, etching, electron beam lithography, spin coating, dip coating, spraying, roller coating, electroplating, etc. As those skilled in the art will appreciate, various alternative deposition methods may be useful in this regard, which collectively include sputtering, CVD, atomic layer deposition (ALD), and evaporation. Additional processes and materials are described in U.S. Pat. No. 7,129,133, Lohn A J et al., "Optimizing $TaO_x$ memristor performance and consistency within the reactive sputtering "forbidden region"," *Appl. Phys. Lett.* 2013; 103:063502; Lohn A J et al., "A CMOS compatible, forming free $TaO_x$ ReRAM," *ECS Trans.* 2013; 58(5):59-65; and Lohn A J et al., "Stages of switching in tantalum oxide memristor," *IEEE Intl Memory Workshop*, held 26-29 May 2013 in Monterey, Calif. (4 pp.), each of which is incorporated herein by reference in its entirety.

Memristors can be provided in any useful format and include any other useful components in any useful architecture (e.g., serial and/or parallel schemes). For instance, an array (e.g., a cross-bar array) can include a plurality of memristor devices, where each device is electrically connected to a source and/or a sourcemeter by a line. In one embodiment, the array includes a plurality of devices connected electrically by one or more lines. In another embodiment, the array includes a plurality of m devices and a plurality of m components, each connected electrically by a word line, a source line, and a bit line. Exemplary components include a transistor (e.g., a MOSFET), an amplifier, a decoder, a capacitor, a comparator, a modulator, a switch, a diode, or any other useful electrical component. Any useful number of components and lines may be present. For instance, the array can include x×y=m devices including x bit lines, y word lines, and y source lines, where each of x and y is an integer more than 1.

EXAMPLES

Example 1

Isothermal Switching and Detailed Filament Evolution in Memristive Systems

Filamentary memristive systems tune their resistance state through the modification of nanoscale conduction channels (see, e.g., Yang J J et al., "Memristive devices for computing," *Nat. Nanotechnol.* 2013 January; 8:13-24; Waser R et al., "Redox-based resistive switching memories—nanoionic mechanisms, prospects, and challenges," *Adv. Mater.* 2009; 21(25-26):2632-63; and Waser R et al., "Nanoionics-based resistive switching memories," *Nat. Mater.* 2007; 6(11):833-40). Such memristive systems or memristors are leading candidates for the future of digital memory storage and are believed to enable entirely new approaches to circuitry and computation (see, e.g., Burr G W, "Overview of candidate device technologies for storage-class memory," *IBM J. Res. Develop.* 2008 July; 52(4.5):449-64; Pickett M D et al., "A scalable neuristor built with Mott memristors," *Nat. Mater.* 2013 February; 12:114-7; and Jo S H et al., "Nanoscale memristor device as synapse in neuromorphic systems," *Nano Lett.* 2010; 10:1297-301).

Accordingly, to realize this technological potential, understanding the physical mechanisms that govern memristive switching has become a field of intense research (see, e.g., Waser R et al., *Adv. Mater.* 2009; 21(25-26):2632-63; Strukov D B et al., "The missing memristor found," *Nature* 2008 May; 453:80-3; Mickel P R et al., "A physical model of switching dynamics in tantalum oxide memristive devices," *Appl. Phys. Lett.* 2013; 102:223502; Lee M J et al., "A fast, high-endurance and scalable non-volatile memory device made from asymmetric $Ta_2O_{5-x}/TaO_{2-x}$ bilayer structures," *Nat. Mater.* 2011 August; 10:625-30; and Larentis S et al., "Resistive switching by voltage-driven ion migration in bipolar RRAM—Part II: Modeling," *IEEE Trans. Electron Devices* 2012 September; 59(9):2468-75). However, due to the limited contrast between the filament and its environment and because these phenomena occur at virtually inaccessible lengths scales, characterizations have required formidable experimental effort, thereby limiting physical understanding (see, e.g., Miao F et al., "Continuous electrical tuning of the chemical composition of $TaO_x$-based memristors," *ACS Nano* 2012; 6(3):2312-8; Miao F et al., "Anatomy of a nanoscale conduction channel reveals the mechanism of a high-performance memristor," *Adv. Mater.* 2011 December; 23(47):5633-40; and Kwon D H et al., "Atomic structure of conducting nanofilaments in $TiO_2$ resistive switching memory," *Nat. Nanotechnol.* 2010; 5(2):148-53).

Transmission electron microscopy studies are the de facto characterization technique (see, e.g., Waser R et al., *Nat. Mater.* 2007; 6(11):833-40; Lee M-J et al., *Nat. Mater.* 2011 August; 10:625-30; Miao F et al., *Adv. Mater.* 2011 December; 23(47):5633-40; and Kwon D H et al., *Nat. Nanotechnol.* 2010; 5(2):148-53), yet they typically provide only a single, post-mortem filament state snapshot. Furthermore, despite its fundamental importance, filament temperature evolution is all but unknown experimentally (see, e.g., Mickel P R et al., *Appl. Phys. Lett.* 2013; 102:223502; Larentis S et al., *IEEE Trans. Electron Devices* 2012 September; 59(9):2468-75; Strukov D B et al., "Thermophoresis/diffusion as a plausible mechanism for unipolar resistive switching in metal-oxide-metal memristors," *Appl. Phys. A* 2012; 107:509-18; Strukov D B et al., "Exponential ionic drift: fast switching and low volatility of thin-film memristors," *Appl. Phys. A* 2009; 94:515-9; and Larentis S et al. "Filament diffusion model for simulating reset and retention processes in RRAM," *Microelectron. Eng.* 2011 July; 88(7):1119-23).

Here, we demonstrate that filamentary resistive switching is an isothermal process, and we present and experimentally validate a set of constitutive equations that provides the steady state solution for filamentary resistive switching. We show that the application of these equations to a single hysteresis loop provides a continuous and quantitatively accurate description of the evolution of the filament radius, composition, heat flow, and temperature across the entire resistive switching range. Furthermore, we show that this steady state solution applies to a large range of filamentary metal oxide RRAM switching materials and over almost all experimentally relevant time-scales.

Canonical memristive systems, as predicted by Chua (Chua L O, "Memristor—The missing circuit element," *IEEE Trans. Circuit Theory* 1971 September; 18(5):507-19; and Chua L O et al., "Memristive devices and systems," *Proc. IEEE* 1976 February; 64(2):209-23) modify their resistance state according to the history of applied voltage flux, resulting in smoothly varying, pinched current-voltage (I-V) hysteresis loops (see inset of FIG. 2A-2B). However, memristors based on nanoscale conducting filaments seldom display this canonical curvature. Thermal activation is widely believed to be central to resistive switching (Strukov D B et al., *Appl. Phys. A* 2009; 94:515-9; and Larentis S et al. *Microelectron. Eng.* 2011 July; 88(7):1119-23), and the onset of switching may be interpreted as the activation of drift/diffusion by Joule heating. Decreasing voltage would thereby lower temperature below $T_{crit}$, freezing the resistance state, and explaining the experimentally observed sharp I-V end-points (circled points in FIG. 2B), which are absent in classical memristor theory (FIG. 2B, inset).

Even more intriguing is that these sharp I-V end-points exist at all points throughout resistive switching. FIG. 2B-2C shows hysteresis curves measured on $TaO_x$ memristors where the resistive switching was current-limited for ON switching and voltage-limited for OFF switching (fabrication details have been previously reported in Lohn A J et al., "A CMOS compatible, forming free $TaO_x$ ReRAM," *ECS Trans.* 2013; 58(5):59-65; and Lohn A J et al., "Optimizing $TaO_x$ memristor performance and consistency within the reactive sputtering "forbidden region"," *Appl. Phys. Lett.* 2013; 103:063502, each of which is incorporated herein by reference in its entirety). The different I-V end-points apply significantly different Joule heat doses, however, each switching curve exhibits equally sharp transitions, strongly implying that $T \approx T_{crit}$ at each switching point, and that the resistive switching is an isothermal process. This suggests the presence of an unidentified negative feedback mechanism that balances the system near the thermal activation threshold.

To investigate this negative feedback process, we developed a simplified heat flow model of a filamentary resistive switching device. In steady state, Joule heat ($Q_{tot}$) is generated uniformly in a cylindrical filament and flows out both vertically ($Q_z$) through the electrodes and radially ($Q_r$) through its surroundings (see FIG. 3A). Comparing the total Joule heat generation to the vertical heat flow allows determination of the radial filament surface temperature $T_S$ (see Example 2 herein for derivation):

$$T_S = T_{RT} + \sigma V^2 \frac{d_E}{2k_E d_O}\left[1 - \frac{k_E}{k_F}\frac{r_F^2}{4d_E d_O}\right], \quad \text{(Eq. 1)}$$

where $T_{RT}$ is room temperature, $\sigma$ is electrical conductivity, V is voltage, $d_E$ is electrode thickness, $k_E$ is electrode thermal conductivity, $d_O$ is thickness of the oxide insulator, $r_F$ is filament radius, and $k_E$ is filament thermal conductivity.

Recent experimental evidence has suggested that resistive switching is mediated by filament radius modulations (see, e.g., Yang J J et al., *Nat. Nanotechnol.* 2013 January; 8:13-24; Waser R et al., *Adv. Mater.* 2009; 21(25-26):2632-63; Larentis S et al *IEEE Trans. Electron Devices* 2012 September; 59(9):2468-75). Considering this, the negative sign in Eq. 1 reveals the temperature limiting mechanism for ON switching (lowering resistance): temperature decreases with increasing filament radius. This occurs due to the fact that core temperatures increase with radius and $Q_z \propto \Delta T$. Thus, $Q_z$ increases with a radius faster than heat generation; and $Q_r$ (and as a result, $T_S$) therefore decreases, freezing ion motion at a radius determined by the applied power.

OFF switching (increasing resistance) produces similarly sharp, non-Chuan I-V end-points (see circled points in FIG. 2C), again suggesting that feedback balances the system at the edge of activation, resulting in isothermal switching. Considering Eq. 1, this experimental observation ruled out filament radius changes as an OFF switching mechanism. Decreasing $r_F$ increases temperature, resulting in positive feedback that would amplify rather than self-limit filament temperature. It is highly unlikely that parameters such as the electrode or oxide thickness change substantially and reversibly during switching, therefore, Eq. 1 suggests that decreases in conductivity provide the self-regulation of temperature for OFF switching. Importantly, this suggests that bipolar operation is primarily driven by changes in two independent state variables (radius r and conductivity $\sigma$).

To validate these hypotheses, we must demonstrate that the filament surface temperature $T_S$ decreases with increasing radius and decreasing conductivity, resulting in a constant switching temperature. This is a daunting task, as few (if any) experimental methods can measure the temperature of a nanoscale filament, and TEM imaging typically provides only a snapshot of filament geometry and composition. However, assuming isothermal switching and setting $T_S = T_{crit}$ (assuming all switching occurs with a constant/isothermal radial surface temperature equal to the critical activating temperature), Eq. 1 may be rewritten as a set of constitutive equations defining the system's response to power dissipation (see Example 2 herein for derivation):

$$IV_r = A_r \frac{T_{crit} - T_{RT}}{R - R_{min}} \text{ and} \quad \text{(Eq. 2a)}$$

$$IV_\sigma = A_\sigma \frac{T_{crit} - T_{RT}}{R_{max} - R}, \quad \text{(Eq. 2b)}$$

where $$A_r = \frac{2k_E d_O}{\sigma_{max} d_E}, \quad R_{min} = \frac{k_E}{4\pi \sigma_{max}^2 L_{WF} T_{crit} d_E},$$

$$A_\sigma = \frac{8d_O^2 L_{WF} T_{crit}}{r_{max}^2}, \quad R_{max} = \frac{4d_O^2 L_{WF} T_{crit} d_E}{\pi r_{max}^4 k_E}, r_{max}$$

is the maximum previous filament radius, $\sigma_{max}$ is the saturation conductivity of the ON state, and $L_{WF}$ is the Wiedemann-Franz constant. The subscripts r and $\sigma$ in Eq. 2a-2b denote which variable is allowed to change in Eq. 1, and can roughly be interpreted here as ON and OFF switching, respectively. Comparing these equations to resistive switching data provides a direct test of both the isothermal assumption as well as the predicted state variables for both ON and OFF switching (radius and conductivity, respectively)

FIG. 3B compares memristive switching data with Eqs. 2a-2b, demonstrating strong agreement between theory and experiment with the use of only three physical fitting parameters: $T_{crit}$, $k_E$, and $\sigma_{max}$ ($r_F$ is determined via $R = d_O/\sigma \pi r_F^2$ during ON switching). In fitting the curves, a single $<T_{crit}$, $\sigma_{max}$, $k_E>$ combination is determined that is consistent with all switching points, therefore demonstrating that the isothermal assumption is accurate across the continuum of resistance values.

Only a single hysteresis loop is shown in FIG. 3B, however, the model has successfully described a diverse set of fabricated devices, with varying device structures, oxide thicknesses (5-15 nm), electrode materials (Ta, Pt, TiN), growth chambers and targets, and areas (100 µm to 350 nm). The physical fitting parameters had quite reasonable ranges over our set of test devices: $8.5 \text{ nm} < r_{max} < 13.2 \text{ nm}$ and $7.2 \times 10^4 \, \Omega^{-1} \, \text{m}^{-1} < \sigma_{max} < 8.3 \times 10^5 \, \Omega^{-1} \, \text{m}^{-1}$ are consistent with the range of previous reports (see, e.g., Miao F et al., *ACS Nano* 2012; 6(3):2312-8); $T_{crit} \approx 1300$ K-1700 K is in close agreement with finite element thermal modeling (Strukov D B et al., *Appl. Phys. A* 2012; 107:509-18; and Larentis S et al. *Microelectron. Eng.* 2011 July; 88(7):1119-23) and is consistent with the observation of nanocrystalline $Ta_2O_5$ near formed filaments (Miao F et al., *Adv. Mater.* 2011 December; 23(47): 5633-40) ($T_{crystallization} \approx 1633$ K); and $89 \text{ W m}^{-1}\text{K}^{-1} < k_E < 200 \text{ W m}^{-1}\text{K}^{-1}$, which considering the expected overestimation due to the assumed cylindrical electrode geometry, is in good agreement with an expected value for the device electrodes (see Example 4 herein and FIG. 9 for the curve fits corresponding to these fitting parameters). Additionally, the prediction of $R_{min}$ is in quantitative agreement with previous reports (Lohn A J et al., "Dynamics of percolative breakdown mechanism in tantalum oxide resistive switching," *Appl. Phys. Lett.* 2013; 103:173503).

Here, $r_{max}$ and $\sigma_{max}$ represent the maximum radius and conductivity throughout switching. However, $r_F$ and $\sigma$ are free to vary during ON and OFF switching, respectively. Therefore, combining Eqs. 2a-2b with the known cylindrical resistance, $R = d_O / \sigma \pi r_F^2$, provides a continuous description of the evolution of each of these parameters throughout the entire switching range (i.e., Eq. 2a implicitly describes multi-level resistance state setting: by choosing a SET or RESET power, any analog resistance value may be programmed). Importantly, it should be emphasized that continuous characterizations of these parameters were previously prohibitively difficult (r, σ) (Miao F et al., *ACS Nano* 2012; 6(3):2312-8; and Miao F et al., *Adv. Mater.* 2011 December; 23(47):5633-40) if not experimentally impossible (T, $k_E$) (Strukov D B et al., *Appi. Phys. A* 2012; 107:509-18; and Larentis S et al. *Microelectron. Eng.* 2011 July; 88(7):1119-23).

In fact, successful in situ characterization of filament geometry and composition during switching has only very recently been accomplished (Park G S et al., "In situ observation of filamentary conducting channels in an asymmetric $Ta_2O_{5-x}/TaO_{2-x}$ bilayer structure," *Nat. Commun.* 2013 September; 4:2382; and Chen J Y et al., "Dynamic evolution of conducting nanofilament in resistive switching memories," *Nano Lett.* 2013 July; 13:3671-7). In contrast, Eq. 2a provides a complete filament characterization using a single hysteresis curve.

Additionally, it should be noted that the thermal conductivity reported for the electrodes is in fact an effective term that may take into account the thermal resistance of the entire vertical surrounding and could include effects from interlayer dielectrics, substrates, and vias. However, as the total thermal resistance is in fact the most important factor, we view this as a strength rather than a limitation of the model.

Figure 5:
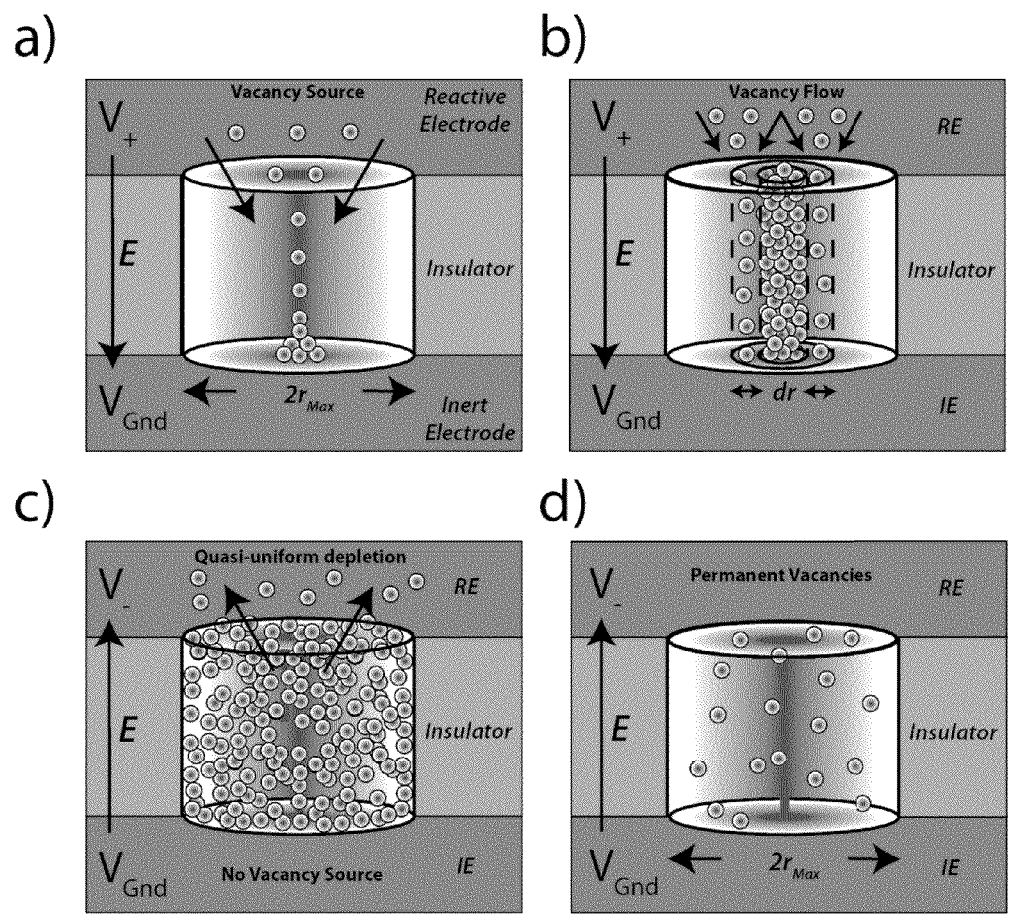
FIG. 5 shows schematics of microscopic ionic flux in a memristor. a) During ON switching ($V_+$ on top reactive electrode RE), vacancies first flow in the hot filament center and "pile-up" at the bottom electrode interface due to the insolubility of $O^{2-}$ in the bottom inert electrode IE. b) Once a uniform oxygen vacancy saturation is reached inside a core filament radius, additional vacancy flux acts to increase the filament radius within the insulator. c) During OFF switching ($V_-$ on top electrode), vacancy saturation no longer limits ion motion, and because the inert electrode has no reservoir of vacancies, the filament is quasi-uniformly depleted. d) After vacancy depletion has completed, some permanent vacancy locations remain.

Surprisingly, assuming the presence of bipolar motion due to drift and specifying when it is thermally allowed are all that is necessary to describe the state evolution, and circumvents specifying additional complex microscopic mechanisms. However, a qualitative physical depiction is still beneficial, and FIG. 5 provides such a depiction for multiple switching regimes.

During ON switching, vacancies first flow in the hot center of a previously electroformed region and "pile-up" due to the low solubility of $O^{2-}$ in an inert electrode (FIG. 5a). This process continues until a core filament reaches a uniform oxygen vacancy saturation concentration.

Next, the vacancies flow toward the outer edges of the filament where the concentration is sub-saturation (FIG. 5b). This process continues until the temperature falls below activation or the power required for continued switching diverges as the radius increases, causing $R \rightarrow R_{min}$ ($P \rightarrow \infty$, per Eq. 2a).

During OFF switching, vacancy saturation no longer limits ion motion, and the filament is quasi-uniformly depleted as vacancies leave vertically without replacement from the inert electrode (FIG. 5c). The effective conductivity decreases until the temperature falls below activation or all vacancies have left and $R \rightarrow R_{max}$. The depletion is described as 'quasi-uniform' because vacancies will leave the center of the filament where $T_{crit}$ is reached first, possibly leading to filament ruptures as predicted by Larentis et al., *IEEE Trans. Electron Devices* 2012 September; 59(9):2468-75. A discussion of when filament ruptures occur during OFF switching is provided in Example 3 herein.

Prior to rupture, current is subsequently diverted from these regions, self-limiting their thermal activation and leading to depletion in neighboring regions (Eq. 2b applies most accurately once this process has stabilized). Finally, because OFF states are experimentally less resistive than virgin devices, it is highly likely that some permanent oxygen vacancy locations remain (FIG. 5d).

Figure 6:
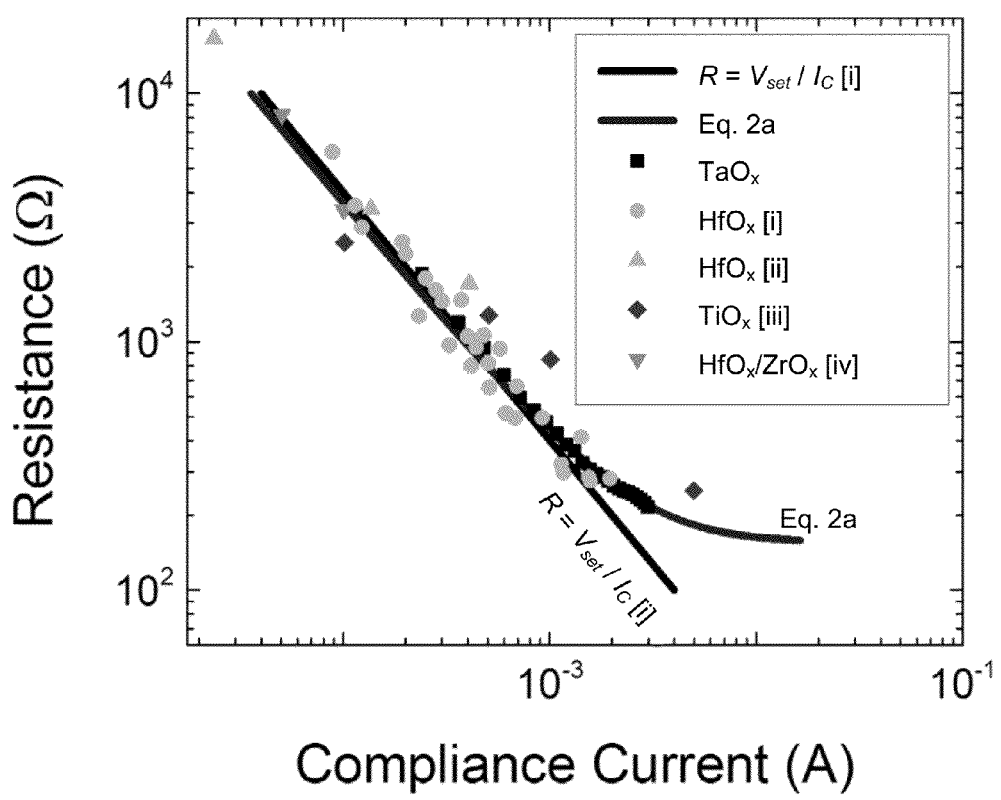
FIG. 6 is a graph comparing the resistive switching model for memristors formed from various materials. Shown are fits to Eq. 2a and the suggested empirical relation, $R=V_{set}/I_C$ introduced in Park G S et al., "In situ observation of filamentary conducting channels in an asymmetric Ta$_2$O$_{5-x}$/TaO$_2$ bilayer structure," *Nat. Commun.* 2013 September; 4:2382, where $V_{set}\approx 0.4$ V and $I_C$ is the compliance current. Eq. 2a is shown to recover this result and generalize it to the low resistance regime, where $V_{set}$ departs from a constant value. Data are provided from memristors described in [i] D. Ielmini D et al., "Evidence for voltage-driven set/reset processes in bipolar switching RRAM," *IEEE Trans. Electron Devices* 2012 June; 59(8):2049-56; [ii] Lee HY et al., "Low power and high speed bipolar switching with a thin reactive Ti buffer layer in robust HfO$_2$ based RRAM," *IEEE Intl Electron Devices Meeting (IEDM)*, held on 15-17 Dec. 2008, in San Francisco, Calif. (pp. 1-4); [iii] Park J et al., "Resistive switching characteristics of ultra-thin TiO$_x$," *Microelectron. Eng.* 2011 July; 88(7):1136-9; and [iv] Lee J et al., "Diode-less nano-scale ZrO$_x$/HfO$_x$ RRAM device with excellent switching uniformity and reliability for high-density cross-point memory applications," 2010 *IEEE Int'l Electron Devices Meeting (IEDM)*, held on 6-8 Dec. 2010, in San Francisco, Calif. (pp. 19.5.1-19.5.4).

FIG. 6 shows the reproduction of an empirical approximation, $R = V_{set}/I_C$ (where $I_C$ is the compliance current, and $V_{set}$ is held constant at 0.4 V), which was shown to approximate resistive switching events in a large range of materials: $HfO_X$; $TiO_X$; $ZrO_X$; and $TaO_X$ (see the following for a complete description of these devices: Ielmini D et al., "Evidence for voltage-driven set/reset processes in bipolar switching RRAM," *IEEE Trans. Electron Devices* 2012 August; 59(8): 2049-56; Lee H Y et al., "Low power and high speed bipolar switching with a thin reactive Ti buffer layer in robust $HfO_2$ based RRAM," 2008 *IEEE Int'l Electron Devices Meeting* (IEDM), held on 15-17 Dec. 2008, in San Francisco, Calif. (pp. 1-4); Park J et al., "Resistive switching characteristics of ultra-thin $TiO_x$," *Microelectron. Eng.* 2011 July; 88(7):1136-9; and Lee J et al., "Diode-less nano-scale $ZrO_x/HfO_x$ RRAM device with excellent switching uniformity and reliability for high-density cross-point memory applications," 2010 *IEEE Int'l Electron Devices Meeting* (IEDM), held on 6-8 Dec. 2010, in San Francisco, Calif. (pp. 19.5.1-19.5.4)).

Also shown in FIG. 6 is a fit to the constitutive equation presented here (Eq. 2a). The constitutive equation reproduced the empirical trend at high resistance and shows improved agreement at lower resistance. The departure from the empirical fit at low resistance resulted from the breakdown of the constant voltage approximation in that range. Since Eq. 2a analytically determined the set voltage, this departure was accurately predicted and could be physically understood. Reproduction of the empirical relation and the agreement with multiple switching materials suggested a universal applicability of Eqs. 2a-2b to a wide range of filamentary resistive switches.

Figure 7:
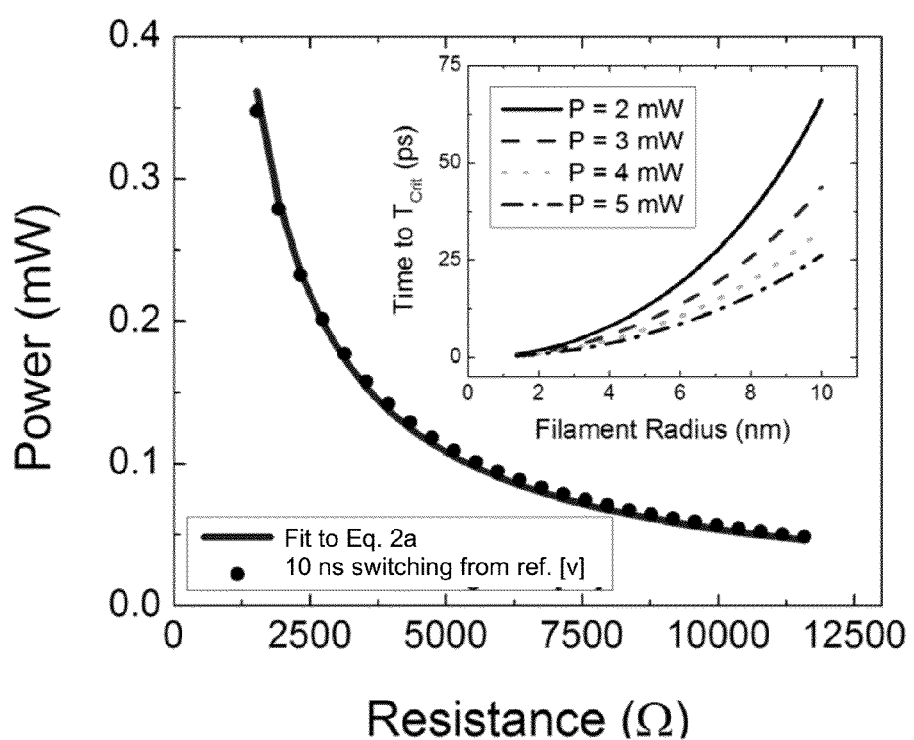
FIG. 7 shows high speed switching data from ref [v], as compared to Eq. 2a. The strong agreement suggests that a thermal steady state exists at the nano-second time-scale and that Eq. 2a is relevant at small time-scales. Inset: The time necessary for the system to heat to $T_{crit}$ was calculated according to Eq. 3 for multiple applied powers, suggesting that activating temperatures may be reached for most filament sizes in less than 100 ps. Ref. [v] is Strachan J P et al., "Measuring the switching dynamics and energy efficiency of tantalum oxide memristors," *Nanotechnology* 2011; 22(50): 505402.

The constitutive equations derived herein assume a time-independent temperature during switching, and therefore only describe resistive switching that occurs slower than thermal steady state. FIG. 7 compares 10 ns switching data digitized from Strachan J P et al., "Measuring the switching dynamics and energy efficiency of tantalum oxide memristors," *Nanotechnology* 2011; 22(50):505402, with fits to Eq. 2a, demonstrating strong quantitative agreement, and suggesting thermal steady state is achieved at sub-nanosecond time-scales.

This result is supported by a simple heat flow dynamics model:

$$\dot{Q}_{gen} = N_F C_F \frac{dT_F}{dt} + N_E C_E \frac{dT_E}{dt} + dG_{T,z} A(T_F - T_{RT}), \quad \text{(Eq. 3)}$$

where $\dot{Q}_{gen}$ is the Joule heat generation, $N_F$ is the number of moles of the filament material (e.g., an insulator), $C_F$ is the molar heat capacity of the filament material (e.g., an insulator, such as $TaO_x$ or any herein), $N_E$ is the number of moles of the electrode material, $C_E$ is the molar heat capacity of electrode material (e.g., Ta or any herein), dT/dt is the time derivative of temperature, $dG_{T,z}$ is the z interfacial thermal conductance (measured directly by fits to Eq. 2a), and $A = \pi r_F^2$ is the cross-sectional filament area. Setting $T_E = \frac{1}{2} T_F$ (assuming a linear temperature gradient, the average electrode temperature is roughly half of $T_E$), Eq. 3 determines the time required for a cylindrical filament to reach an activating temperature of $T_{crit} \approx 1500$ K. As shown in the inset of FIG. 7, Eq. 3 suggests quite rapid heating, as filaments as large as 10 nm require less than 100 ps to activate.

In conclusion, we derived and experimentally verified a set of constitutive equations that govern steady state filamentary memristive switching. These equations identified and explained the self-limiting thermal physics which controls both ON and OFF isothermal switching. We demonstrated that applying these equations to a single hysteresis loop allows any researcher with a voltage/current sourcemeter to characterize the internal structure and evolution of the conducting filament throughout the entire switching process, with a continuous description of its composition, radius, surrounding thermal resistance, and temperature. Additionally, the analytical nature of the solution provides a compact and efficient method to explore device performance dependencies on design parameters. And finally, these steady state constitutive equations were shown to apply to a large range of filamentary resistive switching materials, and over almost all technologically/experimentally relevant time-scales.

Example 2

Thermal Derivation of the Resistive Model Equations

To gain further insight into the governing thermal physics and explore this phenomenon, we developed a first principles heat flow model. In steady state, Joule heat is generated uniformly in a cylindrical conducting filament and flows out both vertically through the electrodes and radially through the surrounding oxide: $Q_{Tot} = IV = Q_r + Q_z$ (see FIG. 3A).

In steady state, Joule heat is generated uniformly in a cylindrical conducting filament and flows out both vertically through the electrodes and radially through the surrounding oxide: $Q_{Tot} = IV = Q_z + Q_r$. Integrating vertical heat determines $Q_z$, but requires knowledge of the temperature profile within the filament. Solving the heat equation in cylindrical coordinates as a function of radius r (Incropera FP, "Fundamentals of Heat and Mass Transfer," 6th ed. 2002: John Wiley & Sons) and with uniform heat generation gives the following:

$$T(r) = \frac{\sigma V^2 r_F^2}{4 d_O^2 k_F}\left(1 - \frac{r^2}{r_F^2}\right) + T_S, \quad \text{(Eq. 4)}$$

where $\sigma$ is the electrical conductivity, V is the voltage across the device, $d_O$ is the thickness of the oxide insulator, $r_F$ is the filament radius, $k_F$ is the thermal conductivity of the filament, $T_S$ is the temperature on the outer radial surface of the filament (see temperature profile in FIG. 3A), and the filament is assumed to be cylindrical.

Approximating the local $\hat{z}$ thermal conductance as $dG_{T,z} = k_E dA/d_E$ (where $d_E$ is the electrode thickness, $k_E$ is the thermal conductivity of the electrode, dA is a differential area of the filament, and $T_{RT}$ is room temperature), we calculate the total $\hat{z}$ heat flow as follows:

$$Q_Z = 2 \int_0^{2\pi} \int_0^{r_F} \frac{(T(r) - T_{RT}) k_E}{d_E} r \, dr \, d\theta = \quad \text{(Eq. 5)}$$
$$\frac{\pi r_F^4 \sigma V^2}{4 d_O^2 k_F} \frac{k_E}{d_E} + 2\pi r_F^2 \frac{k_E}{d_E}(T_S - T_{RT}).$$

Regarding $k_E$, the effective thermal conductivity is expected to be larger than that of the electrode material itself because of the geometric factor resulting from the increased top electrode area.

With $Q_{Tot}$ and $Q_z$ known, $Q_r$ can be used to determine the radial surface temperature via a radial thermal resistance: $T_S - T_{RT} = Q_r R_{T,r}$. Defining $r_{RT}$ as the radius, where $T = T_{RT}$, $R_{T,r}$ may be calculated as: $R_{T,r} = \ln(r_{RT}/r_F)/2\pi d_O k_O$, where $d_O$ and $k_O$ are the thickness and thermal conductivity of the oxide, respectively.

Solving for $T_S$ gives the following:

$$T_S = T_{RT} + \frac{\frac{\sigma V^2 \ln(r_{RT}/r_F) r_F^2}{2 d_O^2 k_O}\left[1 - \frac{k_E}{k_F} \frac{r_F^2}{4 d_E d_O}\right]}{1 + \ln(r_{RT}/r_F) \frac{k_E}{k_O} \frac{r_F^2}{d_E d_O}}. \quad \text{(Eq. 6)}$$

Additionally, by noting that $$\ln(r_{RT}/r_F) \frac{k_E}{k_O} \frac{r_F^2}{d_E d_O} \gg 1,$$

Eq. 6 may be simplified as follows:

$$T_S \approx T_{RT} + \sigma V^2 \frac{d_E}{2 k_E d_O}\left[1 - \frac{k_E}{k_F} \frac{r_F^2}{4 d_E d_O}\right]. \quad \text{(Eq. 7)}$$

With $r_{RT}$ at least an integer factor of $r_F$, $\ln(r_{RT}/r_F)$ will be greater than 1. For most of the switching range, $r_F^2$ is comparable to $d_E d_O$. And lastly, $k_E/k_O$ will be much greater than one, as the metal electrodes are sure to have much larger thermal conductivities than the surround oxide. Combining these factors, we conclude that the simplification of $T_S$ is warranted and, thus, we arrive at present Eq. 1.

This simplification has important physical significance. In calculating $R_{T,r}$ we have ignored vertical heat flow in the surrounding oxide, and determining the value of $r_{RT}$ is difficult. However, this simplification makes the functional form of $R_{T,r}$ and choice of $r_{RT}$ irrelevant, as they fall out of the equation completely.

By solving Eq. 7 for $V^2$ and dividing by the resistance of the cylindrical filament ($R=d_O/\sigma\pi r_F^2$), Eq. 7 relates the power dissipated in the cylindrical filament to its electrical resistance ($IV=V^2/R$):

$$IV = \frac{T_{crit} - T_{RT}}{\frac{d_E}{2k_E\pi r_F^2} - \frac{1}{8\pi\sigma L_{WF}T_{crit}d_O}}, \quad \text{(Eq. 8)}$$

where the Wiedemann-Franz law ($k_F=\sigma L_{WF}T_{crit}$) has been used. Allowing single state variables to vary at a time, and representing them with the device resistance, results in the set of constitutive equations presented herein (e.g., Eqs. 2a-2b).

For ON switching, the filament has constant conductivity and a varying radius, therefore, using the device resistance to represent the filament radius ($r_F^2=d_O/\sigma\pi R$), we find as follows:

$$IV_r = A_r \frac{T_{crit} - T_{RT}}{R - R_{min}}. \quad \text{(Eq. 2a)}$$

For OFF switching, the filament has constant radius and a varying conductivity, therefore, using the device resistance to represent the filament conductivity ($a=d_O/\pi r_F^2 R$), we find as follows:

$$IV_\sigma = A_\sigma \frac{T_{crit} - T_{RT}}{R_{max} - R}. \quad \text{(Eq. 2b)}$$

For Eqs. 2a-2b, $$R_{min} = \frac{k_E}{4\pi\sigma_{max}^2 L_{WF}T_{crit}d_E}, \quad A_r = \frac{2k_E d_O}{\sigma_{max}d_E},$$

$$R_{max} = \frac{4d_O^2 L_{WF}T_{crit}d_E}{\pi r_{max}^4 k_E}, \quad A_\sigma = \frac{8d_O^2 L_{WF}T_{crit}}{r_{max}^2},$$

and $r_{max}$ is the maximum previous filament radius.

Example 3

Discussion of Filament Ruptures

Figure 8:
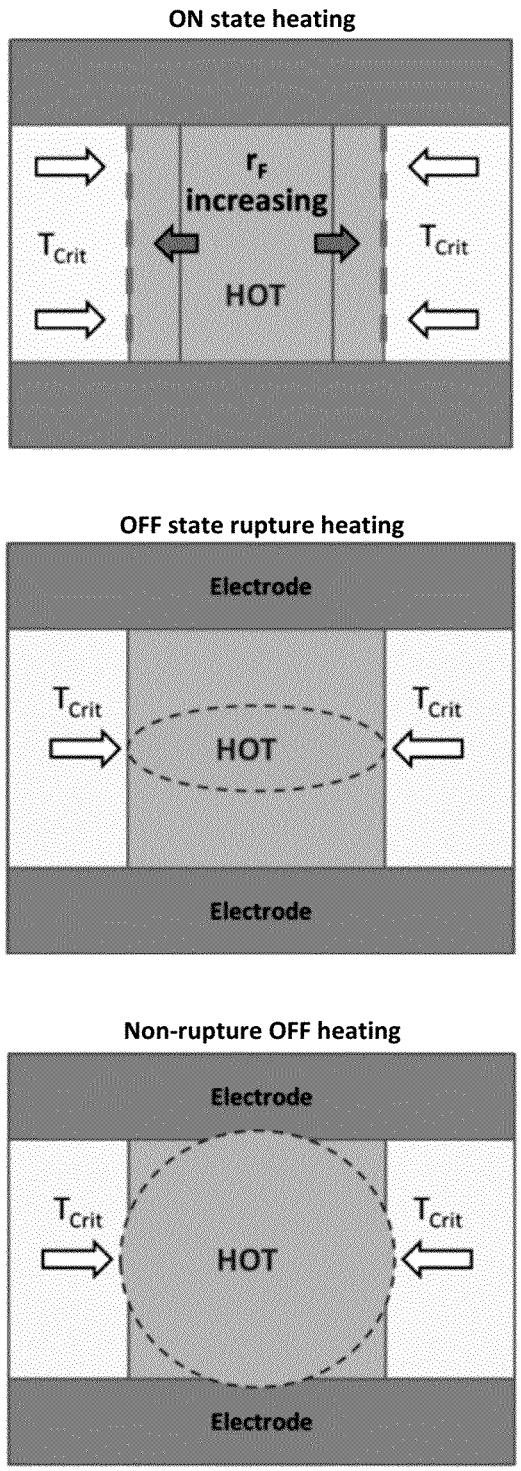
FIG. 8 shows schematics of the effect of ON and OFF states for filament radius $r_f$ and filament rupture.

Filament ruptures have been observed in TEM experiments, as well as predicted by finite element simulations. In contrast, the model presented herein predicts a 'quasi-uniform' depletion of oxygen vacancies in the conducting filament, as opposed to the localized depletion associated with ruptures. In fact, the model presented here is consistent with ruptures, and predicts them to occur, however we believe this phenomenon takes place at much later stages of OFF/RESET switching. Below, we present a simple thermal/electrical experiment that we believe clearly demonstrates this viewpoint in our data. The validity of this viewpoint can be tested by considering the difference in power required to switch the same filament configuration ON or OFF. FIG. 8 shows schematics of the filament during ON state heating (SET switching, top schematic), OFF state switching (RESET switching, center schematic), and non-rupture OFF heating (bottom schematic).

It is widely believed that the conducting filament changes radius during ON/SET switching. The important physical point to note is that in order for the radius to increase during the ON/SET switching, the entire filament must be thermally activated (or equivalently, it's surface temperature must reach $T_{crit}$) (FIG. 8, top schematic).

If it is true that OFF switching is dominated by ruptures, then switching occurs only at the center of the filament where heating first occurs. The volume which has reached $T_{crit}$ at the onset of resistive switching (i.e. electrical resistance change) would be approximately the volume shown in the center schematic in FIG. 8.

It is clear that the rupture driven OFF/RESET switching scenario would require substantially less power, as the filament is in an identical configuration but is only required to heat a fraction of the volume. However, considering FIG. 3B, we see that the resistance state does not begin to change in OFF/RESET switching until a power very close to that of the ON/SET switching power. This means that the heating dose required to initiate resistive switching is the same as was required to heat the edge of the filament during ON switching, and that vacancies in large volume of the filament are active during switching (see, FIG. 8, bottom schematic).

Because the resistance state does not change until this power level is reached, and because it is likely that a large portion of the filament can reach the activating temperature, we may conclude that switching is likely not limited to the localized volume at the center of the filament as required by rupture driven OFF switching. However, it is still true that at late stages of switching, ruptures may occur.

Example 4

Analysis of Additional Devices

Figure 9:
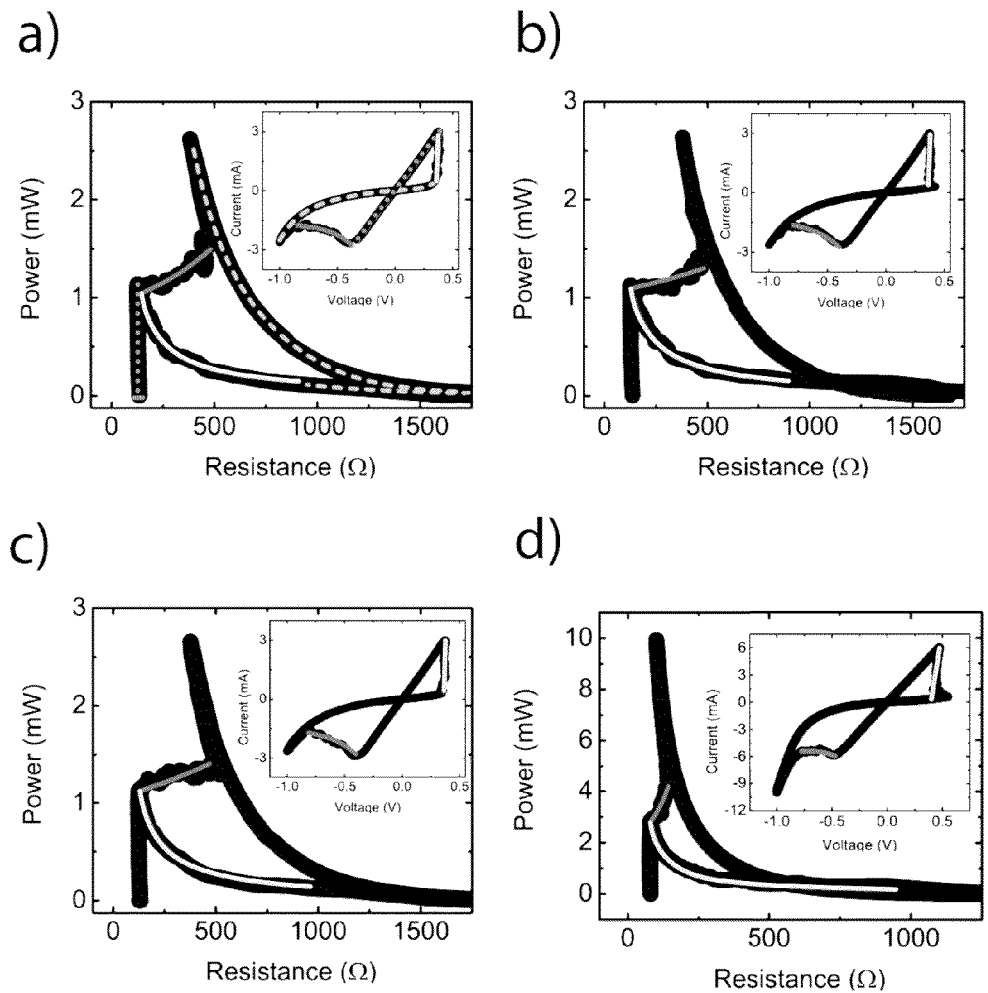
FIG. 9 shows the resistive switching model applied for multiple devices with varying properties and structures. Provided are data for devices having the following configurations: (a) a Pt/TaO$_x$/Ta/Pt device; (b) a device neighboring the structure tested in (a); (c) an inverted stack, i.e., a Pt/Ta/TaOx/Pt device; and (d) a CMOS compatible TiN/TaOx/Ta device. Fitting parameters were as follows: (a) $T_{crit}$=1650 K, $k_E$=145.3 W m$^{-1}$K$^{-1}$, and $\sigma_{max}$=6.25e5 $\Omega^{-1}$ m$^{-1}$; (b) $T_{crit}$=1706 K, $k_E$=146.5 W m$^{-1}$K$^{-1}$, and $\sigma_{max}$=6.3e5 $\Omega^{-1}$ m$^{-1}$; (c) $T_{crit}$=1740 K, $k_E$=151.6 W m$^{-1}$K$^{-1}$, and $\sigma_{max}$=6.9e5 $\Omega^{-1}$ m$^{-1}$; and (d) $T_{crit}$=1520 K, $k_E$=193.4 W m$^{-1}$K$^{-1}$, and $\sigma_{max}$=5.9e5 $\Omega^{-1}$ m$^{-1}$.

To demonstrate the robustness of the model, we have fit Eq. 2a to multiple different devices with varying properties and structures. FIG. 9 shows the results of these fits, and Table 1 shows the fitting parameters resulting from each fit.

TABLE 1

| Device | $T_{crit}$ [K] | $\sigma_{max}$ [$\Omega^{-1}$m$^{-1}$] | $k_E$ [Wm$^{-1}$K$^{-1}$] |
|---|---|---|---|
| FIG. 9a | 1650 | 6.25e5 | 145.3 |
| FIG. 9b | 1706 | 6.3e5 | 146.5 |
| FIG. 9c | 1740 | 6.9e5 | 151.6 |
| FIG. 9d | 1520 | 5.9e5 | 193.4 |

The device fit in FIG. 9a is the device discussed in Example 1 (i.e., a Pt/TaO$_x$/Ta/Pt device). The device in FIG. 9b is a neighboring device on of the same wafer, demonstrating that similar devices have similar switching properties and fitting parameters. The device in FIG. 9c is a device with an inverted stack (Pt/Ta/TaO$_x$/Pt). Finally, the device in FIG. 9d is a CMOS compatible TiN/TaO$_x$/Ta device complete with metallic vias and an ILD layer which is fully CMOS compatible. As can be seen, the resistive model accurately described the switching behavior of devices formed from different materials and different structures.

Example 5

Modeling of Filamentary Resistive Memory by Concentric Cylinders with variable Conductivity We demonstrate a method for simulating memristors (resistive random access memories), where the filament is modeled as a set of nanoscale or sub-nanoscale concentric cylinders, each having its own conductivity. This approach allows for the inclusion of multiple state variables, which we have experimentally observed to control electrical behavior, such as thresholding and learning rate. The simulations accurately reproduce the I-V hysteresis loop, as well as these more complex experimental behaviors resulting from more intricate switching histories. The models can be used in both static and dynamic simulations, and are based upon physical design parameters, such that optimized values from simulations can be easily linked to device design.

Memristors or resistive random access memories (RRAM) change their resistance in a non-volatile manner in response to applied electrical signal (see, e.g., Yang J J et al., "Memristive devices for computing," *Nat. Nanotechnol.* 2013 January; 8:13-24; and Mickel P R et al., "Memristive switching: Physical mechanisms and applications," *Mod. Phys. Lett. B* 2014 April; 28(10): 1430003). They are promising as non-volatile memories due to excellent speed, size, power consumption, and endurance (see, e.g., Torrezan A C et al., "Sub-nanosecond switching of a tantalum oxide memristor," *Nanotechnology* 2011; 22(48):485203; Lohn A J et al., "Analytical estimations for thermal crosstalk, retention, and scaling limits in filamentary resistive memory," *J. Appl. Phys.* 2014; 115:234507; Strachan J P et al., *Nanotechnology* 2011; 22(50):505402; and Lee M-J et al., *Nat. Mater.* 2011 August; 10:625-30), but their electrical behavior is novel in passive circuit elements and is therefore unfamiliar to most circuit designers.

Despite their relative youth, these devices have already prompted significant interest and promise in applications such as threshold logic and neuromorphic computing (see, e.g., Rajendran J et al., "An energy-efficient memristive threshold logic circuit," *IEEE Trans. Comput.* 2012 April; 61(4):474-87; Gao L et al., "Programmable CMOS/memristor threshold logic," *IEEE Trans. Nanotechnol.* 2013 January; 12(2):115-9; Pershin Y V et al. "Experimental demonstration of associative memory with memristive neural networks," *Neural Networks* 2010; 23:881-6; Jo S H et al., *Nano Lett.* 2010; 10:1297-301; and Lohn A J et al., "Memristors as synapses in artificial neural networks: Biomimicry beyond weight change," in *Cybersecurity Systems for Human Cognition Augmentation: Advances in Information Security, Springer,* 2014; 61:135-50).

In order to make progress in developing these circuits and to create new circuits that utilize the novel properties of these devices, good computational simulators are needed. Although many memristive or RRAM simulators exist (see, e.g., Kvatinsky S et al., "TEAM: ThrEshold adaptive memristor model," *IEEE Trans. Circuits Syst.* 2013 January; 60(1): 211-21; Li H et al., "A SPICE model of resistive random access memory for large-scale memory array simulation," *IEEE Electron Device Lett.* 2014 February; 35(2):211-3; Biolek Z et al., "SPICE model of memristor with nonlinear dopant drift," *Radioengineering* 2009 June; 18(2):210-4; and Abdalla H et al., "SPICE modeling of memristors," *IEEE Intl Symp. on Circuits and Systems,* held on 15-18 May 2011 in Rio de Janeiro, pp. 1832-5), a satisfactory solution has not been presented. Many of these simulators are based on the idealized memristor equations (see, e.g., Chua L O, *IEEE Trans. Circuit Theory* 1971 September; 18(5):507-19) and, therefore, do not capture important features of real devices, such as thresholding and bounded resistance ranges (see, e.g., Nardi F et al., "Resistive switching by voltage-driven ion migration in bipolar RRAM—Part I: Experimental study," *IEEE Trans. Electron Dev.* 2012 September; 59(9):2461-7; and Lohn A J et al., *Appl. Phys. Lett.* 2013; 103:173503). We are not presently aware of any model, outside of full finite-element simulation (Larentis S et al., *IEEE Trans. Electron Devices* 2012 September; 59(9):2468-75), capable of incorporating multiple state variables, which have been shown experimentally to significantly alter device behavior (Lohn A J et al., "Degenerate resistive switching and ultrahigh density storage in resistive memory," arXiv:1406.4033 [cond-mat.mtrl-sci], accessible from arxiv.org/abs/1406.4033).

Additionally, convergence can be a problem for some of the simulators, making the simulation of large scale circuits (such as crossbar arrays) impossible. Finally, an ideal simulator would be based on physical parameters so that optimal properties identified in the simulation can be communicated directly to the fabrication team to accelerate real device, circuit, and system development. Here, we present a computationally compact simulator based on physical design parameters. The simulator is capable of reproducing the complex switching characteristics that arise from complex switching histories.

A recent analytical model was developed that provides the steady state solution for memristive switching as a function of applied power (see, e.g., Examples 1 and 2 herein, as well as Mickel P R et al., *Adv. Mater.* 2014; 26:4486-9, which is incorporated herein by reference in its entirety). The model also identified additional state variables that can be used to control electrical characteristics such as the switching threshold. This steady state approach has been validated for even the fastest data recorded to date, so a time-varying output can be accurately calculated from a time-varying input signal by finding the steady state solution at every step in time. This approach greatly simplifies the simulation by eliminating the need to specify a time-dependence for the memristor response and by eliminating the associated integration required to calculate the memristance.

Figure 10:
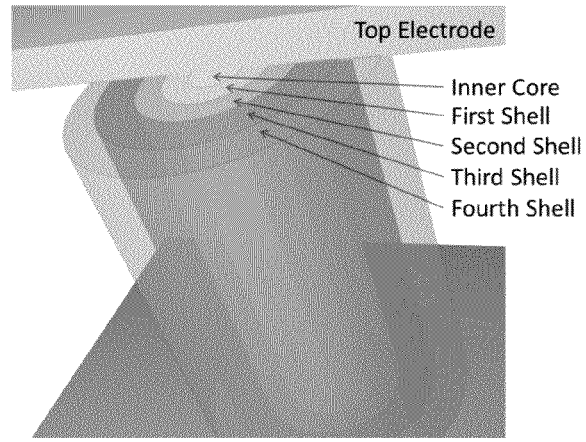
FIG. 10 is a schematic of a shell-based simulator for a filament. Half of the top electrode is removed to show a conducting filament modeled using concentric shells. Each shell has its own concentration and therefore conductivity. The resistance of the device was calculated as the parallel sum of the shell resistances.

In one example, the simulator or model included a set of concentric rings (referred to as shells) as shown in FIG. 10. Each shell had its own resistance, and the total device resistance was calculated as the parallel sum of the individual shell resistances. Each shell had a variable quantity that was meant to represent the concentration of oxygen vacancies. The conductivity of each shell was calculated from the concentration variable C and the applied voltage V as a weighted sum of an Ohmic term and a Poole-Frenkel term, which provides a nonlinear conduction mechanism:

$$\sigma = \sigma_{sat}\left[\frac{C - C_{min}}{C_{min}} + \left(1 - \frac{C - C_{min}}{C_{min}}\right)aVe^{b\sqrt{V}}\right], \quad \text{(Eq. 11)}$$

where $\sigma_{sat}$ is the saturation conductivity, $C_{min}$ is the minimum concentration (50 units), and a and b are Poole-Frenkel coefficients. The Poole-Frenkel term neglects substantial self-heating effects and may not represent the correct physics, but it was sufficiently representative for most applications. Where other nonlinearity mechanisms are preferred, they can be easily exchanged in Eq. 11 (see, e.g., Sze S M & Ng K K (eds.), *Physics of Semiconductor Devices,* 3rd ed. (John Wiley & Sons, 2007), p. 227), such as in the following:

$$\sigma = \sigma_{sat}\left[\frac{C - C_{min}}{C_{min}} + \left(1 - \frac{C - C_{min}}{C_{min}}\right)f(V)\right], \quad \text{(Eq. 24)}$$

where f(V) represents any useful conduction mechanism, such as a Frenkel-Poole equation (e.g., Eq. 12 herein or f(V)=aVexp(b√V~c), where a, b, and c are Poole-Frenkel coefficients), a Fowler-Nordheim equation (e.g., $f(V)=aV^2 \exp(-b/V)$, where a and b are Fowler-Nordheim coefficients), a direct tunneling equation (e.g., $f(V) \propto \exp(-1/V)$), a trap-assisted tunneling equation, a space-charge limited conduction (SCLC) equation (e.g., $f(V) \propto aV^2$ for a trap-free insulator, where a is a SCLC coefficient, e.g., $d^3$, where d is sample thickness), a thermionic emission equation (e.g., $f(V) \propto V$ or $f(V) \propto V\exp(V^2)$), a Schottky emission equation (e.g., $f(V) \propto \exp(a\sqrt{V})$, where a is a Schottky coefficient; or a trap-limited equation, e.g., $f(V) \propto a \exp(b\sqrt{V})$ when the electronic mean free path is less than the insulator thickness, where a is a Richardson-Schottky coefficient and b is a Schottky coefficient), a trap-filled limit equation (e.g., $f(V) \propto V^2$), a hopping conduction equation (e.g., $f(V) \propto \exp(V)$), an ionic conduction equation (e.g., $f(V) \propto \exp(V)$), and an Ohmic conduction equation (e.g., $f(V) \propto V$).

In real devices, the concentration of oxygen vacancies cannot exceed some saturation value, which results in a corresponding saturation conductivity (Larentis S et al., *IEEE Trans. Electron Devices* 2012 September; 59(9):2468-75) that can be measured electrically via a hysteresis loop (see, e.g., Example 1 herein and Mickel P R et al., *Adv. Mater.* 2014; 26:4486-90, which is incorporated herein by reference in its entirety).

In our simulations, we normalized the conductivity of the Ohmic term to the saturation conductivity. The Poole-Frenkel term was fit to the completely switched OFF state with the concentration variable set to the minimum concentration value, thereby identifying the coefficients a and b as follows:

$$I = aVe^{b\sqrt{V}} \quad \text{(Eq. 12)}$$

Then, the conductivity of each shell was calculated from Eq. 11 in which the concentration variable C is allowed to vary.

Allowing the conductivity of each shell to change by modulating its concentration value led to resistance changes in the device. Deciding which shells were allowed to change, and by how much, was the primary objective of the simulation. The analytical model described herein provided the limiting expressions for both ON and OFF switching. At powers less than those specified in Eq. 13, the temperature inside the device was too low to allow for ionic motion and no switching occurred:

$$P = \frac{(T_{crit} - T_{RT})/R}{\frac{\sigma d_E}{2k_E d_O} - \frac{r_F^2}{8L_{WF}T_{crit}d_O^2}}, \quad \text{(Eq. 13)}$$

where P is the applied power, R is the resistance required to activate resistive switching, $T_{crit}$ is the critical temperature for ion motion, $T_{RT}$ is the ambient temperature of the device, $\sigma$ is conductivity corresponding to the saturation concentration, $d_E$ is electrode thickness, $k_E$ is electrode thermal conductivity, $d_O$ is the thickness of the oxide insulator, $r_F$ is filament radius, and $L_{WF}$ is the Weidemann-Franz constant.

Eq. 13 can be written in a simplified form for ON and OFF switching, as shown in Eqs. 14a and 14b, respectively:

$$P_{ON} = A_r \frac{T_{crit} - T_{RT}}{R - R_{min}} \text{ and} \quad \text{(Eq. 14a)}$$

$$P_{OFF} = A_\sigma \frac{T_{crit} - T_{RT}}{R_{max} - R}, \quad \text{(Eq. 14b)}$$

where $$A_r = \frac{2k_E d_O}{\sigma d_E}, \quad R_{min} = \frac{k_E}{4\pi\sigma^2 L_{WF}T_{crit}d_E},$$

$$A_\sigma = \frac{8d_O^2 L_{WF}T_{crit}}{r_{op}^2}, \quad R_{max} = \frac{4d_O^2 L_{WF}T_{crit}d_E}{\pi r_{op}^4 k_E}, \quad P_{ON}$$

is the applied power for ON switching, $P_{OFF}$ is the applied power for OFF switching, $r_{op}$ is the largest previous filament radius, and other parameters are as in Eq. 13 (i.e., parameters R, $T_{crit}$, $T_{RT}$, $\sigma$, $d_E$, $k_E$, $d_O$, and $L_{WF}$).

During ON switching, vacancies enter the filament in the center (where temperature and therefore ionic mobility is highest) until the central region saturates (see, e.g., FIG. 5). Continued injection of vacancies forces the saturated region to expand since it is not possible for them to be incorporated in the already saturated region. In the simulation, ON switching progressed by increasing the number of saturated shells, starting from the center, until Eq. 14a was satisfied. If the power supplied was less than the right hand side of Eq. 14a, then insufficient power was being supplied to achieve thermal activation and allowed ions to move.

During OFF switching, if sufficient power was supplied, then the region of highest concentration became thermally activated and the concentration of vacancies within that entire region decreased until the power was no longer sufficient for continued switching. The condition for OFF switching power is given in Eq. 14b.

To summarize, for ON switching, the number of saturated shells was incremented until Eq. 14a was satisfied. For OFF switching, the concentration of the group of shells with the highest concentration was decremented until the Eq. 14b was satisfied.

For comparison to experiment, we used CMOS-compatible TaOx-based RRAM devices (Lohn A J et al., *ECS Trans.* 2013; 58(5):59-65 and Lohn A J et al., *Appl. Phys. Lett.* 2013; 103:063502). Values for $\sigma_{max}$, $k_E$, and $T_{crit}$ were identified from fitting to the ON-switching data as described herein and as shown in the inset of FIG. 11B. The Poole-Frenkel a and b parameters were fit from the OFF state (e.g., using Eq. 12). All other parameters were known from the fabrication process. All parameters were included in the simulation code provided in Example 6, along with the code used to extract them from the I-V data.

Figure 11A:
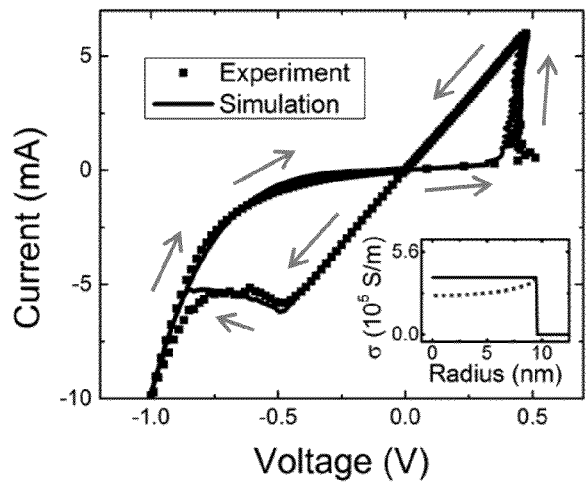
FIGS. 11A-11B shows I-V and P-R loops reproduced by an exemplary shell-based simulator. (A) An I-V hysteresis loop can be reproduced very accurately using the shell-based simulator once the device parameters are found (inset of FIG. 11B). (A, inset) Also provided is a conductivity profile during OFF switching in a simulation (solid line) and the core depression that is expected in real devices (dotted line). (B) The I-V traces can also be represented in P-R coordinates that are more natural to the equations described herein. (B, inset) Also provided is a fit based on device parameters.
Figure 11B:
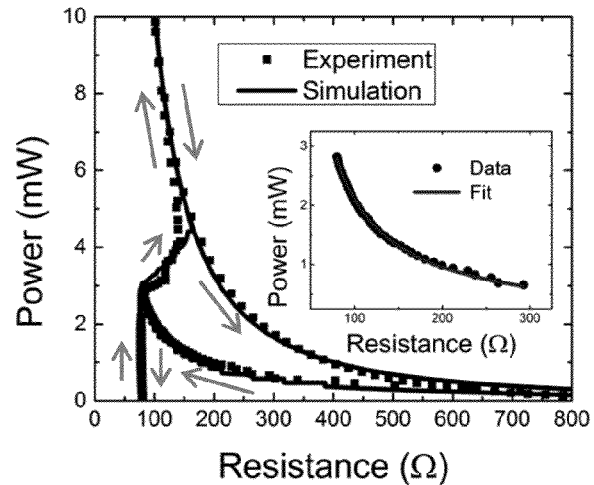

As seen in FIG. 11A, the simulation was able to reproduce the I-V hysteresis loop with reasonable accuracy in terms of the resistance values for ON and OFF states, the threshold values for ON and OFF switching, and the range of resistance states throughout switching. The data are also shown in P-R coordinates (FIG. 11B), which are the more natural frame for Eqs. 13 and 14a-14b.

Three regions in FIG. 11A-11B stood out as being inexact. The first is the nonlinear conductivity of the OFF state. As described earlier, the Poole-Frenkel mechanism may not be the most appropriate physics, and we have ignored substantial self-heating. However, this approach is simple and sufficiently accurate for most applications.

Second, the negative sloping region at the start of ON switching was not captured exactly. That region corresponds to increases in concentration prior to reaching the saturation concentration of the core region (Lohn A J et al., "Mechanism of electrical shorting failure mode in resistive switching," *J. Appl. Phys.* 2014; 116:034506), which is not included in this simulation. That behavior can be included by allowing a group of core shells to increase concentration gradually instead of proceeding immediately to saturation. Such additional steps can add computational time, and it is difficult to estimate the number of shells that constitute the core.

Third, the discrepancy during OFF switching was due to an approximation made during simulation; the simulation decrements conductivity uniformly, but in a real device the conductivity will decrease from the center shells first. In addition, their concentration will stay slightly lower than the rest of the decreasing filament. This concept is illustrated in the inset of FIG. 11A, where the radial conductivity profile is depicted for a simulated device (solid line) and depressed device (dotted line) as might be expected in reality. We refer to this difference as the uniformly decreasing concentration assumption (UDCA). Although this approximation leads to inexact OFF-switching behavior, it is sufficiently accurate for most cases.

Interestingly, in both the simulation and experiment, there was noise during switching. During OFF switching, the noise was controlled by the step size in the concentration variable. In contrast, during ON switching, it was controlled by the size of the shell radius. In FIG. 11A-11B, there were 50 concentration steps, which may be larger than in a real device, leading to small noise in the simulation. The shell radius was set to 1 angstrom (approximately atomic scale), and the noise was comparable to experiment, suggesting that the ON switching noise may be related to the atomic nature of radius expansion.

Figure 12:
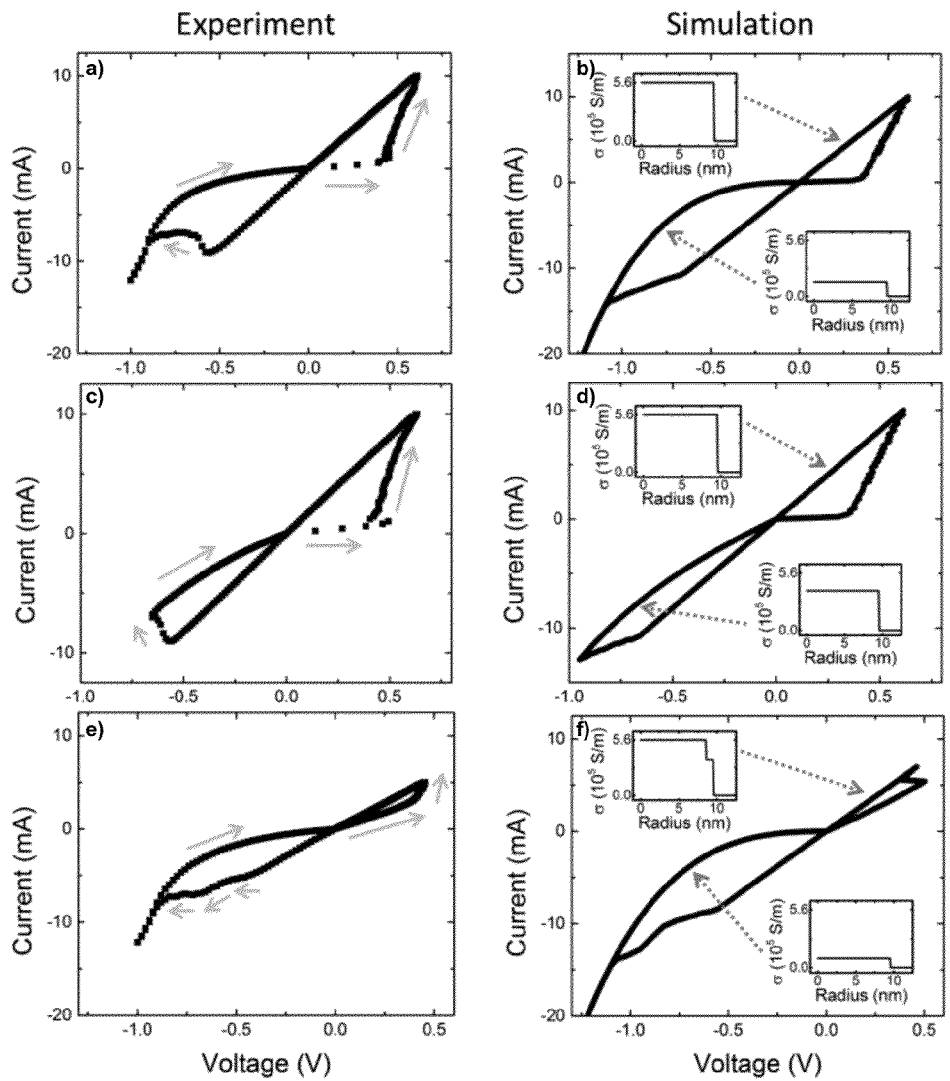
FIG. 12 provides graphs showing that device behavior can depend on complex histories. Provided are (a, b) a simple hysteresis loop, as well as (c, d) partial OFF switching followed by (e, f) partial ON switching, which leads to a step in the conductivity profile (upper inset off) and causes a bump in the OFF switching (e, f). Shown are experimental data (left) and simulations (right) with conductivity profile after every half cycle (inset, right).

Demonstrating simple behavior (e.g., where the device is cycled between consistent endpoints, as in FIG. 11A-11B) is a mandatory requirement of simulation. Another main benefit of this shell-based approach was the ability to rapidly simulate more complex histories and behaviors. An example of this complex behavior is shown in FIG. 12, where partial OFF and ON switching is used to create new features in the current-voltage relation. The conductivity profile of the filament following each half-cycle is also provided as insets throughout the progression to show how the device configuration evolves. In this example, a device with a particularly poor UDCA was chosen to illustrate the limitations of our approach.

In FIG. 12($a,b$), a simple hysteresis loop is shown, where thresholding and resistance values are accurately replicated. However, the exaggerated upward curl during OFF switching was not reproduced accurately because of the poor UDCA.

In FIG. 12($c,d$), a complicated history was developed by only partially OFF switching the device. Due to the difference in OFF switching behavior caused by the poor UDCA, the simulator required slightly higher voltage to replicate the experiment but stills showed very similar behavior in at least a qualitative sense. Partial OFF switching also led to decreased nonlinearity seen in both experiment and simulation.

As shown in FIG. 12($e$), this complex history led to a change in threshold for ON switching and a clear bump in the OFF switching experiment. Both of these behaviors were captured well by the simulator in FIG. 12($f$).

These complex switching characteristics arose because there was more than one state variable in both the real devices and the simulator. The radius of the filament was allowed to change but so did the conductivity of any region within that radius. The conductivity of each shell was a state variable, and so very intricate behavior was created in real devices and represented with shell-based simulation. These types of effects could be used to store large amounts of information in multi-dimensional information spaces or to control thresholds or learning rates in neural systems.

The specific conductivity profiles for this series of configurations are shown as insets in FIG. 12 but much more complicated profiles can be created to provide more interesting electrical behavior. In the case of the bump in OFF switching in FIG. 12($e, f$), the two-level conductivity profile in the top inset of FIG. 12($f$) was the important characteristic. During OFF switching, the inner section started switching first until its concentration decreased to the level of the outer section. At that point, more power was required before switching can continue so the device was temporarily stabilized, leading to the bump in the I-V loop.

Figure 13A:
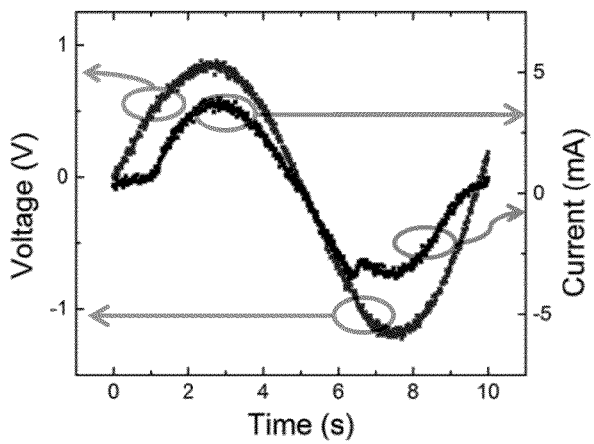
FIG. 13A-13B shows graphs of the steady state simulator, which can be used to provide the output waveform for a time-varying input signal. Provided are (A) an experimental demonstration and (B) a simulation, where a sine wave with increasing amplitude was used as an input signal.
Figure 13B:
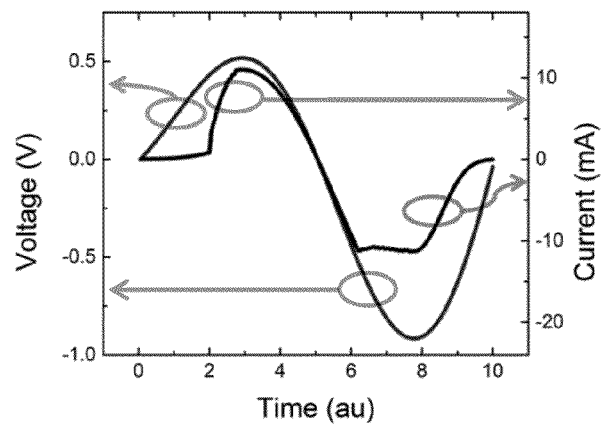

Often the goal of a device simulation is not to generate the current-voltage relation but to study the output waveform for a given input waveform (see, e.g., Duan L et al., "Periodicity and dissipativity for memristor-based mixed time-varying delayed neural networks via differential inclusions," *Neural Networks* 2014 September; 57:12-22; and Radwan A G et al., "HP memristor mathematical model for periodic signals and DC," *IEEE Int'l Midwest Symp. on Circuits and Systems*, held on 1-4 Aug. 2010 in Seattle, Wash., pp. 861-4). This is a difficult task for many simulators but was implemented with the steady state simulation described herein. An example is shown in FIG. 13A-13B, where a sinusoid with increasing amplitude was used as the input signal to generate an experimental curve (FIG. 13A) and a simulation (FIG. 13B). The experimental current was measured using a 100Ω series resistor. This experiment was conducted at very slow timescales (~10 seconds period) to illustrate the steady state nature of both the simulation and the experiment. As mentioned herein, the equations used in this model have been validated for the fastest data recorded to date (~1 ns) so higher-speed simulations are also possible, though they may require increasing the value of the activation temperature slightly.

In summary, a modeling approach was developed for simulating memristor or RRAM electrical behavior based on modulation of the oxygen concentration within a conducting filament composed of many concentric shells. This approach accurately reproduced simple electrical behavior such as the current-voltage hysteresis loop and basic time-varying responses, but it was also able to reproduce much more complicated behavior. By allowing the conductivity of each shell to vary separately, complex device histories and conductivity profiles were generated, which led to intricate characteristics that were observed in corresponding experiments. Also, since any change or optimization in the simulation was accomplished by changing physical design parameters (e.g., such as thickness or thermal conductivity), optimized parameters from simulation could be communicated directly to designers to help create a wide range of device properties, electrical characteristics, and even systems level designs.

Example 6

Exemplary Python Code for Simulations

The models herein can be implemented in any useful manner, such as by employing a numerical simulator. As the equations rely on a steady state model, time-dependent simulations are not needed. Instead, the simulator can rely on a set that spatially defines the evolving filament (e.g., as a set of concentric cylinders or shells having different variables, such as filament conductivity σ for a particular radius r, where $0 \leq r \leq r_{max}$, where $r_{max}$ is the maximum filament radius). Then, based on this set, saturation conductivity σ can be determined for each shell (e.g., employing Eq. 11 herein), ON switching can be progressed by increasing the number of saturated shells (e.g., employing Eq. 14a), OFF switching can be progressed by decreasing the concentration of shells with the highest concentration (e.g., by employing Eq. 14b), and the OFF state can be simulated by normalizing the conductivity of the Ohmic term to the saturation conductivity (e.g., by employing Eq. 12). An exemplary simulation Python code is accompanied with this application as a computer program listing appendix, which is available in the Patent and Trademark Office patent file and is incorporated by reference in its entirety.

Example 7

Analytical Estimations for Thermal Crosstalk, Retention, and Scaling Limits in Resistive Memory Here, we discuss the thermal effects on scaling, retention, and error rate in resistive memories from a theoretical perspective using an analytical approach. Starting from the heat equation, we derived the temperature profile surrounding a resistive memory device and calculated its effect on neighboring devices. Then, we determined the engineering tradeoffs that are expected with continued scaling, such as retention and power use per device. Based on our calculations, we expect scaling to continue well below ten nanometers but that the effect of heating from neighboring devices may need to be considered for some applications even at current manufacturing capabilities. In the following, we address possible designs to alleviate some of these effects, while further increasing device density.

Shrinking device dimensions have created powerful computers with immense storage capacity. This pace of progress has been the cornerstone of much technological and commercial development but has become increasingly difficult to continue. Particularly in memory, new non-transistor devices are being given substantial attention as a means to prolong this progress (see, e.g., Dieny B et al., "Emerging non-volatile memories: magnetic and resistive technologies," *J. Phys. D: Appl. Phys.* 2013; 46(7):070301; Ielmini D, "Reliability issues and modeling of Flash and post-Flash memory," *Microelectron. Eng.* 2009 September-July; 86(7-9):1870-5; and Burr G W, "Overview of candidate device technologies for storage-class memory," *IBM J. Res. Develop.* 2008 July; 52(4.5):449-64).

Among the leading candidates is resistive random access memory (RRAM) or memristors because of their non-volatility, speed, endurance, low power operation, and ability to store immense numbers of states in a single device (see, e.g., Wong H S P et al., "Metal-oxide RRAM," *Proc. IEEE* 2012 June; 100(6):1951-70; Mickel P R et al., "Memristive switching: Physical mechanisms and applications," *Mod. Phys. Lett. B* 2014 April; 28(10):1430003; Yang J J et al., "Memristive devices for computing," *Nat. Nanotechnol.* 2013; 8(1):13-24; Torrezan A C et al., "Sub-nanosecond switching of a tantalum oxide memristor," *Nanotechnology* 2011; 22(48):485203; Lee M J et al., "A fast, high-endurance and scalable non-volatile memory device made from asymmetric $Ta_2O_{5-x}$/$TaO_{2-x}$ bilayer structures," *Nat. Mater.* 2011 July; 10:625-30; Strachan J P et al., "Measuring the switching dynamics and energy efficiency of tantalum oxide memristors," *Nanotechnology* 2011; 22:505402; and Lohn A J et al., "Degenerate resistive switching and ultrahigh density storage in resistive memory," *Appl. Phys. Lett.* 2014; 105:103501 (2014)). They have also been shown to operate at very small device dimensions (<10 nm) (Zhang Z et al., "Nanometer-scale $HfO_x$ RRAM," *IEEE Electron. Device Lett.* 2013 July; 34(8):1005-7), which is promising, but the ultimate scalability of these devices is still not known.

Understanding the limits of these filaments and the interactions between neighboring filaments is critical to understanding the ultimate scaling potential, and the device performance tradeoffs associated with continued miniaturization. This understanding is difficult to achieve experimentally because the active regions are nanometers in dimensions, switching occurs on sub-nanosecond timescales, and they are necessarily encased in an electrode material. In this Example, we adopt an analytical approach to describe the filament and its surrounding region, leading to insights about engineering tradeoffs, such as scaling, retention, and power consumption.

Recently, an analytical framework was introduced that provides a detailed description of the properties of the conducting filament, including its: radius, composition, and its thermal properties (see, e.g., Examples herein, as well as Mickel P R et al., "Isothermal switching and detailed filament evolution in memristive systems," *Adv. Mater.* 2014; 26:4486-90). This analytical framework can guide the design of devices, such as to optimize device dimensions, heat flow, and temperatures within and surrounding the device. These temperatures can determine the retention of the device itself and for dense memory arrays; the temperature surrounding the device may affect the retention of neighboring devices due to thermal cross-talk (Strukov D B et al., "Exponential ionic drift: fast switching and low volatility of thin-film memristors," *Appl. Phys. A* 2009; 94(3):515-9).

The analytical framework is summarized in the following equations that are derived for a cylindrical conducting filament:

$$IV_r = A_r \frac{T_{crit} - T_{RT}}{R - R_{min}} \text{ and} \qquad \text{(Eq. 2a)}$$

$$IV_\sigma = A_\sigma \frac{T_{crit} - T_{RT}}{R_{max} - R}, \qquad \text{(Eq. 28)}$$

where $$A_r = \frac{2k_z d_O}{\sigma_{max} d_z} \text{ and } A_\sigma = \frac{8d_O^2 L_{WF} T_{crit}}{r_{op}^2}.$$

In these equations, R is resistance, and I and V are current and voltage, respectively, where the subscripts r and σ denote whether resistance changes are modulated by changing the filament radius r or the filament conductivity σ with the other held constant. The variable $r_{op}$ is the operating radius (discussed herein), $\sigma_{max}$ is the saturation conductivity, $L_{WF}$ is the Wiedemann-Franz constant, $T_{RT}$ and $T_{crit}$ are room temperature and the critical temperature for activation of ion motion, respectively. The variable $d_O$ is the oxide thickness, and $d_z/k_z$ is the electrode thickness divided by electrode thermal conductivity. The factor $d_z/k_z$ is used to approximate the thermal resistance for heat traveling from the filament through the electrode for unit electrode area.

Figure 14:
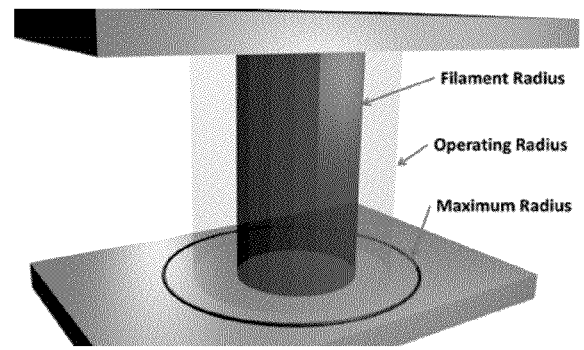
FIG. 14 is a schematic showing three different radii of interest: the maximum radius $r_{max}$ is the largest radius to which the conducting filament can expand; the operating radius $r_{op}$ is the largest radius to which the device has expanded; and the filament radius $r_f$ is the radius to which the dominant pathway has currently expanded. Transparency is used to indicate decreasing conductivity.

There are at least three different types of radii that must be considered within the device. They are depicted in FIG. 14 and are referred to as filament radius $r_f$, operating radius $r_{op}$, and maximum radius $r_{max}$. The maximum radius $r_{max}$ is the most easily understood. It is the largest radius that a device is able to achieve. It corresponds to the minimum resistance that has been observed experimentally (Lohn A J et al., "Dynamics of percolative breakdown mechanism in tantalum oxide resistive switching," *Appl. Phys. Lett.* 2013; 103:17350) and predicted theoretically by the following equations:

$$R_{min} = \frac{k_z}{4\pi\sigma_{max}^2 L_{WF} T_{crit} d_z} \text{ and} \quad \text{(Eq. 15a)}$$

$$R_{max} = \frac{4d_O^2 L_{WF} T_{crit} d_z}{\pi r_{op}^4 k_z}. \quad \text{(Eq. 15b)}$$

These equations also define values for the minimum and maximum resistances that can be achieved in filamentary resistive switching. These two values bound the resistance but do not indicate a lower bound on device dimension. They do however lead to an upper bound for the filament radius $r_{max}$, as can be derived from Eq. 15a:

$$r_{max} = \sqrt{4L_{WF}T_{crit}d_O\sigma_{sat}\frac{d_z}{k_z}}. \quad \text{(Eq. 16)}$$

Since it is not necessary for the RRAM device to operate at the minimum possible resistance (i.e., at $r_{max}$), the value of $r_{max}$ is not necessarily an indication of the device size. It is likely that RRAM devices in most applications will choose to operate at much smaller radii for reasons other than the obvious scaling advantages. Operating at its maximum radius may lead to sacrifices in device performance, as will be discussed later. Instead, we define an operating radius $r_{op}$ that can be designed for and used in our expressions to estimate device performance. A simple way to think about the operating radius is that it is the radius at which the conductivity is high enough that, particularly in the high resistance state, current conduction contributes to heat generation in the device. The radius of this region is often determined by the forming step and remains at a slightly elevated conductivity even after OFF switching (resistance increasing), as evidenced by the decreased resistance of the OFF state as compared to the as-deposited film. In addition, $r_{op}$ is not necessarily the same as the filament radius $r_f$, which we define as the radius of the dominant conduction pathway.

When the device resistance is decreased, a region of high conductivity forms within the device, which can be smaller than the operating radius. The edge of this region is the filament radius $r_f$, which we define as the radius of the dominant conduction pathway. In order to keep the radius well below the maximum radius, the forming power and subsequent ON switching (resistance reduction) powers should all be kept low to suppress increases in the radius during operation. It is worth mentioning that this theory was developed using $TaO_x$-based devices for which the vacancy concentration is believed to be continuously tunable. In devices where changing vacancy concentration involves phase changes between specific metastable states, the conductivities may become discretized but similar definitions for radius should be applicable.

Using the above definitions for radii, we developed expressions for a large number of device properties. To provide reasonable and approximate values, we used parameters measured from the CMOS-compatible devices fabricated in our laboratory (Lohn A J et al., "A CMOS compatible, forming free $TaO_x$ ReRAM," *ECS Trans.* 2013; 58(5):59-65; and Lohn A J et al., "Optimizing $TaO_x$ memristor performance and consistency within the reactive sputtering 'forbidden region'," *Appl. Phys. Lett.* 2013; 103:063502). The maximum radius can be calculated from Eq. 16 by combining the minimum resistance value and $r_{sat}$, which, using the analytical framework derived in herein, can be measured from a current-voltage sweep of the device. For our devices, the maximum radius was approximately 11 nm. It seems intuitive that one would attempt to decrease the maximum radius to improve scaling; but we argue that is not a good approach.

It should be stated clearly that the maximum radius is not a bound on the scaling of the device; it is a point in which further scaling may require implementing limits on the operating range (i.e., it is not necessary to operate up to the maximum radius during switching). Altering design parameters to reduce the maximum radius is possible but could lead to sacrifices in performance.

Figure 15A:
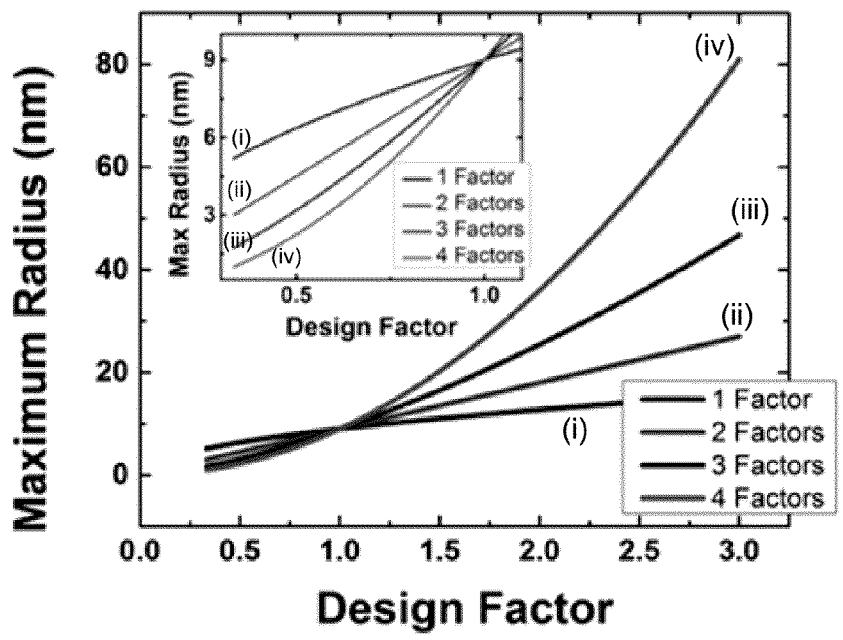
FIG. 15A-15C shows the effects of varying device design parameters over a range of factors from ⅓ to 3. Provided are graphs for the effect on (A) the maximum radius for one, two, three, or four factors (labeled (i)-(iv), respectively), (B) the maximum resistance, and (C) the OFF/ON ratio. Increasing the parameters resulted in improved performance but increased maximum radius; however, the devices do not need to be operated at their maximum radius. Operating at less than the maximum radius further improved performance (dotted curves in FIG. 15B-15C).

The impact of altering design parameters in Eq. 16 ($T_{crit}$, $d_O$, $\sigma_{sat}$, and/or $d_z/k_z$) on the maximum radius is shown in FIG. 15A. The parameters were varied by a factor ranging from ⅓ to 3 of their initial value. This range of controllable variability may not be achievable for all of the parameters, but the same range is shown for ease of comparison. Also, since changes in any one of the four parameters had the same effect on $r_{max}$, FIG. 15A shows the effect of combining parameters (i.e., the effect of changing 1, 2, 3, or all 4 parameters simultaneously). FIG. 15A indicates that for increased scaling (i.e., decreased device dimension), each of the design parameters should be decreased but we argue that this is not true. It is not necessary to operate the device at the full maximum possible radius; and we would like to state that for improved performance, these design parameters should often be modulated in the opposite way.

From a device performance perspective, a primary concern for RRAM implementation is reduction of power consumption or the ability to have large fan-in, which both often requires increasing the resistance of the device. Reducing the operating radius is a straightforward and effective approach to achieving that goal because the maximum resistance ($R_{max}$) is inversely proportional to the fourth power of the operating radius, as seen in Eq. 15b. It is important to note that this maximum resistance is measured at the switching voltage.

Figure 15B:
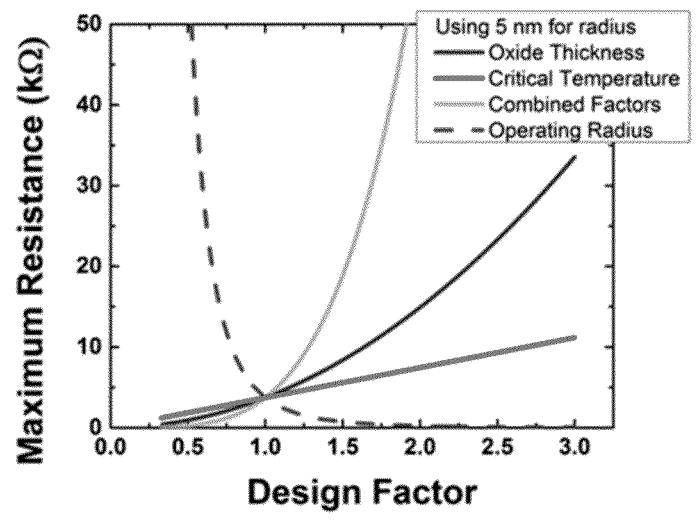

Due to nonlinearity in the current-voltage relation, the maximum resistance at the READ voltage is likely to be much higher. Here, we refer to the maximum resistance with the understanding that it is measured at the SET voltage. This maximum resistance is shown in FIG. 15B, for which the design parameters in Eq. 15b were varied from ⅓ to 3 times their initial value. It can be seen that increasing the design parameters ($T_{crit}$, $d_O$, and/or $d_z/k_z$) improved performance in terms of large maximum resistance values and that operating at radii less than $r_{max}$ also increased maximum resistance. This is in contrast to the result in Eq. 16 and FIG. 15A, where increasing the same parameters resulted in increased $r_{max}$. This is an example of how designing to decrease $r_{max}$ would sacrifice device performance, but this is not an engineering tradeoff because one can simply operate the device at radii less than $r_{max}$ and also benefit in performance (e.g., higher resistance).

Aside from increasing device resistance, there are many other performance metrics of interest, including increasing the ratio of OFF state to ON state resistances. The $R_{OFF}/R_{ON}$ ratio can be expressed as follows:

$$\frac{R_{OFF}}{R_{ON}} = \frac{R_{max}}{R_{ON}} = \frac{4L_{WF}T_{crit}d_O\sigma_{sat}\frac{d_z}{k_z}}{r_{op}^2}. \quad \text{(Eq. 17)}$$

Figure 15C:
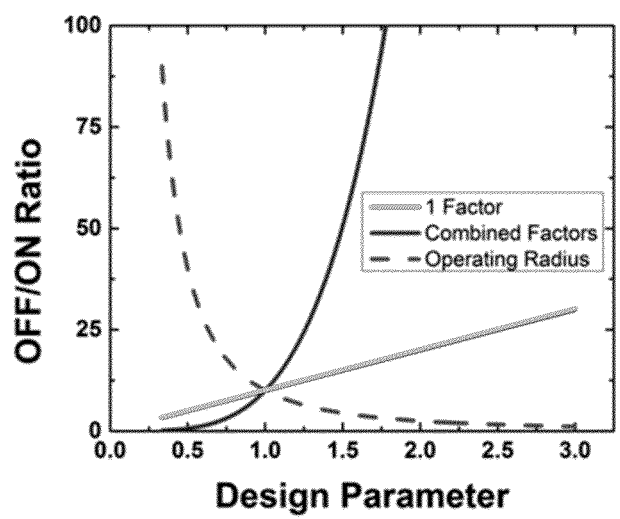

The $R_{OFF}/R_{ON}$ ratio is inversely proportional to the square of the operating radius $r_{op}$, which leads to performance increase for operating at smaller radii. This trend is shown in Eq. 17 and FIG. 15C, where once again, increasing the design parameters ($T_{crit}$, $d_O$, $\sigma_{sat}$, and/or $d_z/k_z$) resulted in improved performance, in contrast to designing for small $r_{max}$. As a result, it is expected that operating the device at $r_{op}$ much less than $r_{max}$ will offer a means to improved device performance and that the 11 nm maximum filament radius for the device studied here is much larger than the dimensions that are expected in high performance devices Ultimately, the filament radius is likely to be only one factor in determining the density limits of RRAM. Large amounts of heat are generated within the filaments, and that heat will have the potential to alter the device state itself or the state of its neighbors as it flows radially. The radial temperature profile T(r) was determined by the radial flow of heat from the filament and the rate at which heat can escape vertically through the electrodes or other encasing materials, as characterized by its thermal conductance component $k_r$. Including vertical heat loss $q_z$ into the steady-state heat equation gave the following:

$$\frac{1}{r}\frac{\partial}{\partial r}k_r r \frac{\partial T}{\partial r} q_z = 0. \quad \text{(Eq. 18)}$$

This heat loss term was approximated within a differential area as follows:

$$q_z = \frac{k_z(\text{Area})}{d_z}(T T_{RT}), \quad \text{(Eq. 19)}$$

where the outer edge of the electrode in the vertical (z-direction) is held at room temperature. This vertical thermal conductivity is likely to be dominated by spreading effects in the electrode or by interfacial thermal resistance, so it is not usually appropriate to think of $k_z$ as a bulk thermal conductivity value. Its value depends strongly on the specific materials, interfacial properties, and geometry; and it should therefore be thought of as an equivalent thermal conductivity.

Then dividing Eq. 19 by the differential volume of the oxide region from which heat is being lost provided the following:

$$\frac{1}{r}\frac{\partial}{\partial r}k_r r \frac{\partial T}{\partial r} \frac{k_z(T T_{RT})}{d_O d_z} = 0. \quad \text{(Eq. 20)}$$

The above equation was analytically solved by the modified Bessel function of the second kind:

$$T = A K_0(\rho) + T_{RT}, \quad \text{(Eq. 21a)}$$

$$A = \frac{(T_{crit} T_{RT})}{K_0\left(\sqrt{\frac{k_z}{k_O d_O d_z}} r_f\right)}, \text{ and} \quad \text{(Eq. 21b)}$$

$$\rho = \sqrt{\frac{k_z}{k_O d_O d_z}} r, \quad \text{(Eq. 21c)}$$

where $K_0$ is the modified Bessel function of the second kind, $k_O$ is the thermal conductivity in the radial direction through the insulating oxide, and $r_f$ is the filament radius that is the radius of the dominant current conduction pathway and may be different from both $r_{op}$ and $r_{max}$.

Figure 16A:
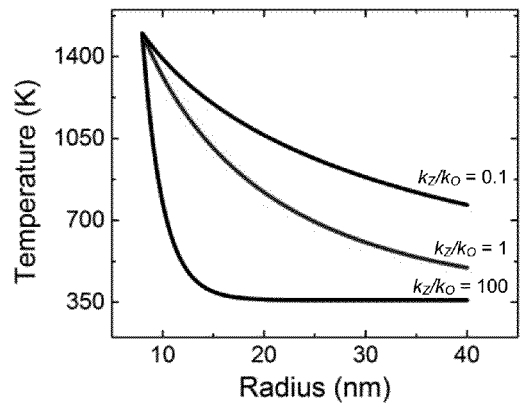
FIG. 16A-16B shows the effects of varying device design parameters on temperature surrounding the filament and the retention ratio. As can be seen (A), the temperature followed a modified Bessel function of the second kind and was modulated by varying design parameters, such as vertical and lateral thermal conductivities, i.e., $k_z$ and $k_O$, respectively. (B) The lateral temperature decreased the retention of neighboring devices, as compared to isolated devices.

FIG. 16A shows the temperature profiles from Eq. 21a-21c for varied thermal conductivity ratio. The temperature dropped quickly from the activation temperature at the edge of the 8 nm filament to room temperature if the vertical thermal conductivity $k_z$ was much greater than the lateral thermal conductivity $k_O$. This is likely to be the case if the vertical material is an electrode and the surrounding material is an insulating oxide, provided that there is negligible interfacial resistance. The thermal boundary conductance was expected to be significant for such dissimilar materials (Hopkins P E, "Thermal transport across solid interfaces with nanoscale imperfections: Effects of roughness, disorder, dislocations, and bonding on thermal boundary conductance," *ISRN Mech. Eng.* 2013:682586). The vertical thermal conductance may be comparable to or even less than the lateral thermal conductance because of the interfacial resistance. In that case, the elevated temperatures could remain for several tens of nanometers, which could be relevant for scaling considerations.

Mathematically, decreases in the prefactor $\sqrt{(k_z/(k_O d_O d_z))}$ from Eq. 21c resulted in a wider temperature profile. Physically, increasing vertical thermal conductivity allowed more heat to escape, such that it does not contribute to the elevated radial temperatures. These elevated radial temperatures could potentially affect the state of neighboring devices if those devices are in close proximity. By treating the device retention and error rate as having Arrhenius behavior, we described the stability of the devices in the presence of self-heating and thermal crosstalk.

The Arrhenius equation describes the exponential temperature dependence of thermally activated processes such as ionic motion (see, e.g., Wei Z et al., "Retention model for high-density ReRAM," *4th IEEE Int'l Memory Workshop (IMW)*, held on 20-23 May 2012 in Milan (pp. 1-4); and Larentis S et al. "Filament diffusion model for simulating reset and retention processes in RRAM," *Microelectron. Eng.* 2011 July; 88(7):1119-23). We compared the retention of a device that is heated by its neighbor to the retention of the same device without heating. We did so by dividing the Arrhenius rate equation evaluated at room temperature by the Arrhenius rate equation evaluated at a temperature as a function of the radius:

$$\text{Retention}_{ratio} = \text{Error Rate}_{ratio}^1 = e^{\frac{T_{crit} T_{crit}}{T(r) T_{RT}}}. \quad \text{(Eq. 22)}$$

This comparison provided a measure of the retention cost of scaling. Since Eq. 22 expresses the relative rate of ionic motion in neighboring filaments at different locations, the expression can be thought of as the ratio of the retention of a filament that is heated by its neighbor to the retention of that same filament with no heating. The same expression can be thought of as the inverse of the error rate, where heated devices experience state changes more frequently.

Figure 16B:
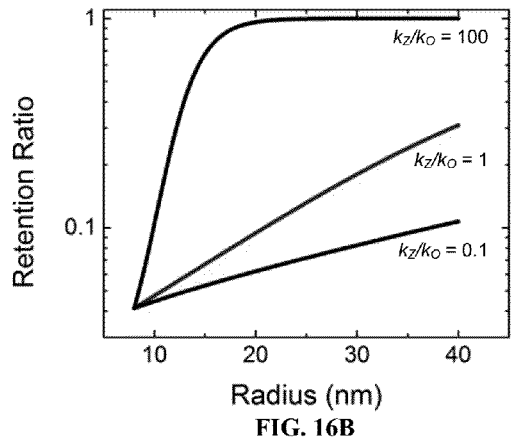

The retention ratio is shown in FIG. 16B for the same devices described in FIG. 16A. FIG. 16B shows the effect of thermal crosstalk on retention ratio, or equivalently inverse error rate, as a function of distance from a neighboring device that is held constant at the switching temperature. This type of operation condition is not a likely scenario for most applications, and acceptable retention times will vary widely between specific applications; but the device design can be easily matched to operational specifications by combining the local temperature (Eq. 21a-21c) with the Arrhenius equation (Eq. 22).

The effect of thermal crosstalk is most likely to increase resistance because the high concentration of vacancies in the filament is unstable without the effect of the driving field that was used to inject them. For that reason, the ON state (low resistance state) may be particularly susceptible to thermal crosstalk.

Figure 17A:
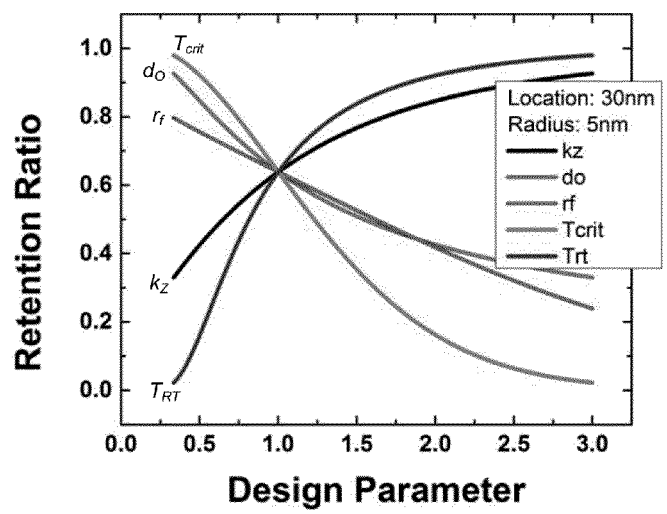
FIG. 17A-17B shows the effects of varying device design parameters in order to control thermal cross-talk between devices. The retention at a location that is (A) 30 nm or (B) 20 nm from the center of a neighboring device held at the switching temperature is shown. The retention was normalized by the retention for an isolated device at room temperature. The effect is shown for a neighboring device with (A) a 5 nm filament radius or (B) a 8 nm filament radius. In one instance, changing the critical temperature $T_{crit}$ or room temperature $T_{RT}$ changes the normalization, so extra attention is needed for interpreting these results.
Figure 17B:
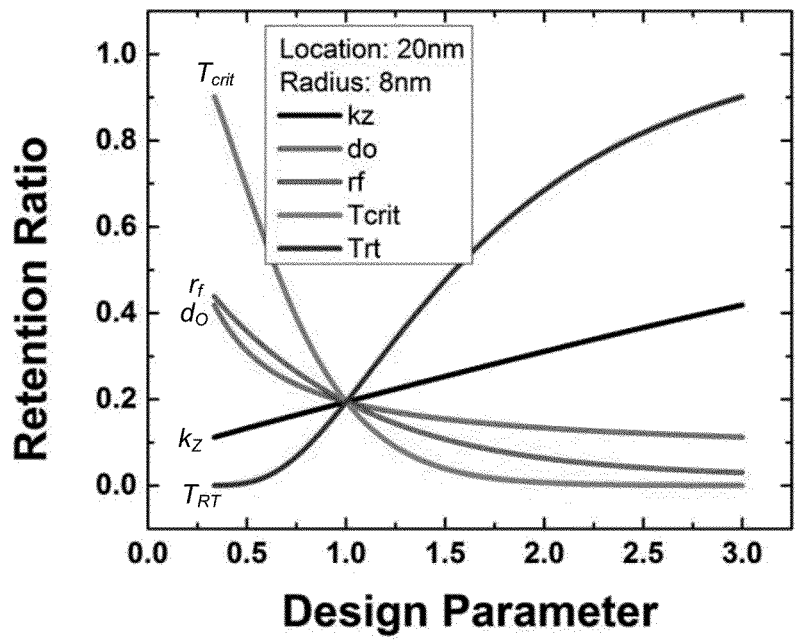

Examples of designing for thermal crosstalk are shown in FIG. 17A-17B, where the retention ratio defined in Eq. 22 is shown for varied design parameters that influence the temperature profile outside the filament. The retention ratio was measured at a location 30 nm from the center of a 5 nm neighboring filament (FIG. 17A) and at a location 20 nm from the center of an 8 nm neighboring filament (FIG. 17B). The neighboring filaments were held constant at the switching temperature. The parameters were varied between ⅓ and 3 times their initial values, which were $T_{crit}$=1500 K, $T_{RT}$=358 K, $k_O$=1 W/mK, $d_O$=10 nm, $d_z$=50 nm, and $k_z$=5 W/mK. Since the radii were varied to values comparable to and larger than the test location, the retention ratio (or inverse error rate) became very low for large radii. The specific values for optimized performance will depend greatly on the application and design constraints, but FIG. 17A-17B is a demonstration of how Eqs. 21a-21c and 22 can be combined to provide design insight regarding thermal crosstalk.

In the context of designing devices to meet scaling specifications, it is worth discussing a few of the engineering tradeoffs that are likely to be encountered as scaling continues. Perhaps the most relevant is between device density and energy consumption per device. As discussed above, when thermal crosstalk becomes a limiting design consideration, increasing the thermal conduction in the vertically direction is a good approach to decreasing radial temperatures and enabling larger device densities. Unfortunately, this approach led to increased power required to maintain $T_{crit}$ within the filament because heat escaped more efficiently. This, in turn, led to higher switching power and likely higher switching voltage.

An alternate approach with the same tradeoff involves designing or selecting materials with increased $T_{crit}$ to increase device density. That change would also lead to increased power requirements as more heat would be required to reach the higher $T_{crit}$ value. In FIG. 17A-17B, increasing $T_{crit}$ led to decreased retention or increased error rates, but that figure is normalized by the retention of an isolated device. Thus, although retention increased, normalized retention (i.e., retention ratio) decreased. In most cases, absolute retention is the performance metric and not relative retention, so the device density could be increased as a result of this added stability but at the cost of increased power.

It may be possible to avoid some of these tradeoffs by designing the devices and their surroundings so as to guide heat flow. By separating the devices laterally with a thermally resistive interlayer dielectric (ILD) it may be possible to reduce both energy consumption and the extent of lateral temperatures, provided that the interlayer dielectric can both hold heat in the filament and suppress the ratio of radial to vertical heat flow between devices. This effect can be further improved by using thermally conductive material or interfaces in the vertical direction between devices.

Other approaches to modulating heat flow can be imagined for increasing power efficiency as well as device scaling. Controlling heat flow in the vertical direction will also have an impact on the device itself, not just its neighbors. Careful design of the devices may be able to improve power efficiency and scaling. One possible approach involves the use of temperature-dependent thermal conductivities and has the additional advantages of decreasing the risk of perturbations caused during a READ operation or due to the half-select problem in crossbar arrays. During the non-pertubative resistance READ, a device will experience significant Joule heating that will eventually degrade the state of the device. The same effect is particularly prevalent in a device that is "half-selected" in a crossbar type architecture. For a device that is constantly at a READ voltage, and where temperature is proportional to the applied power, the above definition of retention ratio or inverse error rate yields as follows:

$$\text{Retention}_{ratio} = \text{Error Rate}_{ratio}^1 = e^{[T_{crit}T_{RT}](\frac{V_{read}}{V_{crit}})^2 + T_{RT}} \frac{T_{crit}}{T_{RT}} \quad \text{(Eq. 23)}$$

Figure 18:
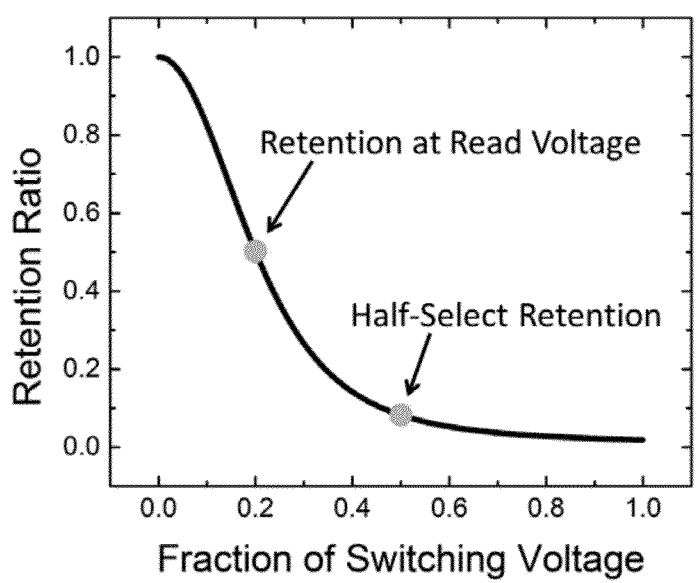
FIG. 18 shows a graph of retention for a device that is continuously exposed to a range of applied voltages. Applying voltages less than the switching voltage will cause self-heating that will increase the error rate or decrease the retention. The retention was normalized by a device with zero voltage applied.

For a continuously half-selected device with a critical temperature of 1500° C. and an ambient temperature of 300K, the error rate increases by an order of magnitude (12.2×) compared to a device that is never half-selected. For the READ operation of a device with the same critical and ambient temperatures being constantly read at 20% of the turn-on voltage (i.e., 100 mV READ for a 0.5 V turn-ON device), the retention is almost halved when compared to a device that is never read. This effect is shown in FIG. 18, highlighting retention loss at the half-select and 20% READ voltages.

The above derivation ignores possible electric field effects that may contribute to retention in partially selected devices. Our results and calculations indicate that the thermal dependence dominates the ionic motion and that the field effects can be ignored over a wide range of conditions. The field dependence of ionic motion could easily be included by adding a hyperbolic sine factor that is also thermally activated (Strukov D B et al., *Appl. Phys. A* 2009; 94:515-9; and Cabrera N et al., "Theory of the oxidation of metals," *Rep. Prog. Phys.* 1949; 12:163-84).

The derivation of Eq. 23 also assumes that all thermal conductivities are temperature independent, but that is not a requirement for device design. A vertical thermal conductivity that is inversely related to temperature would allow heat to escape more efficiently at low temperatures than at high temperatures, thereby decreasing the temperature on a device during READ or half-select. The exponential dependence of activation on temperature indicates that even seemingly small changes in the temperature dependence of thermal conductivity can have significant impact on retention.

Designing electrodes with inverse temperature dependence should be possible. Many electrode materials (including copper and tungsten) have this property intrinsically but common RRAM electrodes such as platinum, tantalum, and titanium exhibit the opposite behavior (see, e.g., Powell R W et al., "Thermal conductivity of selected materials," National Standard Reference Data Series: National Bureau of Standards—8 (Category 5: Thermodynamic and Transport Properties) 1966, U.S. Gov't Printing Office, Washington, D.C. (175 pp.); and Savchenko I V et al., "Thermal conductivity and thermal diffusivity of tantalum in the temperature range from 293 to 1800 K," *Thermophys. Aeromech.* 2008 December; 15(4):679-82), which exacerbates the effect in FIG. 18.

Titanium nitride (TiN), which is a common electrode in CMOS-compatible processing, is even more complicated because the phonon contribution to thermal conductivity increases rapidly with temperature (Taylor R E et al., "Thermal conductivity of titanium carbide, zirconium carbide and titanium nitride at high temperatures," *J. Am. Ceram. Soc.*

1964 February; 47(2):69-73). The total thermal conductivity for TiN decreases over a wide range of temperatures but then increases between 1300° C. and 1800° C. (Shackelford J F et al., "Table 104: Thermal conductivity of ceramics," *Materials Science and Engineering Handbook,* 3rd ed., CRC Press, 2001), which is in the expected range of transition temperatures.

In addition to selecting favorable metals, defect structure can be used to provide thermal conductivity that decreases with increasing temperature (Ju S H et al., "Investigation on interfacial thermal resistance and phonon scattering at twist boundary of silicon," *J. Appl. Phys.* 2013; 113:053513) for increasing retention. Highly doped silicon also has a favorable dependence of thermal conductivity on temperature (Stranz A et al., "Thermoelectric properties of high-doped silicon from room temperature to 900 K," *J. Electron. Mater.* 2013 July; 42(7):2381-7) and may be an interesting choice for electrode material.

In summary, we provided a theoretical justification for device scaling well into the single digit nanometer lateral dimensions without specifying a hard lower limit. We also showed that, as device densities are increased, their thermal interactions will become increasingly important, and we derived analytical expressions for the temperature profile outside of a conducting filament. We used that temperature profile to determine the related effects on retention and error rates of neighboring devices and described, in analytical detail, the retention effects of reading devices and of the potential "half-select" problem. We proposed designs to reduce thermal cross-talk, thereby increasing device density; and we suggested a class of electrode materials that not only increase device density but can help to increase retention in devices that are frequently read or half-selected. Our results discuss several engineering tradeoffs that may need to be considered in highly scaled and densely packed devices, but we believe that RRAM scaling can continue well beyond the capabilities of current commercial manufacturing technologies.

Other Embodiments

All publications, patents, and patent applications, including U.S. Provisional Application No. 61/866,690, filed Aug. 16, 2013, mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A method for operating a resistive memory device, the method comprising:
   providing the device comprising a reactive electrode and an insulator configured to provide a first filament disposed within the insulator, wherein the device is coupled to a monitoring apparatus;
   generating a power-resistance measurement for the device by employing the monitoring apparatus; and
   applying an isothermal model to the power-resistance measurement in order to determine one or more parameters of the device,
   wherein the isothermal model comprises a steady state heat flow model of the filament.

2. The method of claim 1, wherein the power-resistance measurement is a power-resistance loop.

3. The method of claim 1, wherein the generating step comprises performing a sweep or series of applied power $P_{app}$ to the device; and monitoring a resistance R of the device during the sweep or series.

4. The method of claim 1, wherein the generating step comprises performing a sweep or series of applied voltage $V_{app}$ or applied current $I_{app}$ to the device; and monitoring a resistance R or a current I of the device during the sweep or series.

5. The method of claim 4, wherein the generating step further comprises converting the measured I or R values into the power-resistance measurement.

6. The method of claim 4, wherein the series of applied voltage $V_{app}$ comprises a series of discrete voltage pulses $V_{pulse}$.

7. The method of claim 1, wherein the one or more parameters comprises a filament composition σ, a filament radius r, a surrounding thermal resistance k, a saturation conductivity of the ON state $\sigma_{max}$, electrode thermal conductivity $k_E$, a critical activating temperature $T_{crit}$, a filament temperature, a power threshold, a simulated ON switching curve, and/or a simulated OFF switching curve.

8. The method of claim 7, wherein the filament composition σ is a conductivity of the filament in the ON state; the filament radius r is a radius of the filament during ON switching and/or OFF switching; and/or the surrounding thermal resistance k is a resistance of the reactive electrode.

9. The method of claim 1, wherein the steady state heat flow model comprises:
   a radial heat flow component characterized by heat flow away from the filament and radially into the insulator surrounding the filament; and
   a vertical heat flow component characterized by heat flow away from the filament and through the reactive electrode.

10. The method of claim 9, wherein the steady state heat flow model comprises:

$$T_S = T_{RT} + \sigma V^2 \frac{d_E}{2 k_E d_O}\left[1 - \frac{k_E}{k_F}\frac{r_F^2}{4 d_E d_O}\right], \quad \text{(Eq. 1)}$$

wherein $T_{RT}$ is room temperature, σ is electrical conductivity, V is voltage, $d_E$ is electrode thickness, $k_E$ is electrode thermal conductivity, $d_O$ is thickness of the oxide insulator, $r_F$ is filament radius, and $k_F$ is filament thermal conductivity.

11. The method of claim 1, wherein the applying step comprises:
   providing the isothermal model for ON switching, which is expressed as:

$$IV_r = A_r \frac{T_{crit} - T_{RT}}{R - R_{min}}, \quad \text{(Eq. 2a)}$$

wherein $IV_r$ is power dissipation during ON switching, R is resistance during ON switching, $$R_{min} = \frac{k_E}{4\pi\sigma_{max}^2 L_{WF} T_{crit} d_E}, A_r = \frac{2k_E d_O}{\sigma_{max} d_E}, T_{RT}$$

is room temperature, $\sigma_{max}$ is the saturation conductivity of the ON state, V is voltage, $d_E$ is electrode thickness, $k_E$ is electrode thermal conductivity, $d_O$ is thickness of the insulator, $r_F$ is filament radius, $L_{WF}$ is the Wiedemann-Franz constant, $T_{crit}$ is critical activating temperature, and $k_F$ is filament thermal conductivity; and determining a fitting value for each of $T_{crit}$, $k_E$, and $\sigma_{max}$ as applied to an ON switching curve of the power-resistance loop.

12. The method of claim 11, wherein the applying step further comprises;

generating a simulated ON switching curve based on Eq. 2a and the fitting values for each of $T_{crit}$, $k_E$, and $\sigma_{max}$.

13. The method of claim 11, wherein $T_{crit}$ is of from about 1500 K to about 1800 K, $k_E$ is of from about 50 W M$^{-1}$K$^{-1}$ to about 300 W M$^{-1}$K$^{-1}$, and $\sigma_{max}$ is of from about $6\times10^4$ $\Omega^{-1}$ m$^{-1}$ to about $9\times10^5$ $\Omega^{-1}$ m$^{-1}$.

14. The method of claim 1, wherein the applying step comprises:

providing the isothermal model for OFF switching, which is expressed as:

$$IV_\sigma = A_\sigma \frac{T_{crit} - T_{RT}}{R_{max} - R}, \quad \text{(Eq. 2b)}$$

wherein $IV_\sigma$ is power dissipation during OFF switching, R is resistance during OFF switching, $$R_{max} = \frac{4d_O^2 L_{WF} T_{crit} d_E}{\pi r_{max}^4 k_E}, A_\sigma = \frac{8d_O^2 L_{WF} T_{crit}}{r_{max}^2},$$

$r_{max}$ is the maximum previous filament radius, $T_{RT}$ is room temperature, V is voltage, $d_E$ is electrode thickness, $k_E$ is electrode thermal conductivity, $d_O$ is thickness of the insulator, $r_F$ is filament radius, $L_{WF}$ is the Wiedemann-Franz constant, $T_{crit}$ is critical activating temperature, and $k_F$ is filament thermal conductivity; and determining a fitting value for each of $T_{crit}$, $k_E$, and $r_{max}$ as applied to an OFF switching curve of the power-resistance loop.

15. The method of claim 14, wherein the applying step further comprises:

generating a simulated OFF switching curve based on Eq. 2b and the fitting values for each of $T_{crit}$, $k_E$, and $r_{max}$.

16. The method of claim 14, wherein $T_{crit}$ is of from about 1500 K to about 1800 K, $k_E$ is of from about 50 W M$^{-1}$K$^{-1}$ to about 300 W M$^{-1}$K$^{-1}$, and $r_{max}$ is of from about 5 nm to about 20 nm.

17. The method of claim 1, wherein the applying step results in reading an ON state or an OFF state of the first filament.

18. A method for characterizing a resistive memory device, the method comprising:

obtaining a power-resistance measurement for the device, wherein the device comprises a reactive electrode and an insulator configured to provide a first filament disposed within the insulator; and applying an isothermal model to the power-resistance measurement in order to determine one or more parameters of the device, wherein the isothermal model comprises a steady state heat flow model of the filament.

19. The method of claim 18, wherein the applying step comprises employing a set of concentric shells, wherein each shell has a conductivity.

\* \* \* \* \*